(12) United States Patent
Wang et al.

(10) Patent No.: US 12,349,380 B2
(45) Date of Patent: *Jul. 1, 2025

(54) GATE ALL AROUND TRANSISTOR DEVICE AND FABRICATION METHODS THEREOF

(71) Applicant: Taiwan Semiconductor Manufacturing Co., Ltd., Hsin-Chu (TW)

(72) Inventors: Chih-Ching Wang, Kinmen County (TW); Chia-Ying Su, Hsinchu (TW); Wen-Hsing Hsieh, Hsinchu (TW); Kuan-Lun Cheng, Hsin-Chu (TW); Chung-Wei Wu, Hsin-Chu County (TW); Zhiqiang Wu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/155,392

(22) Filed: Jan. 17, 2023

(65) Prior Publication Data

US 2023/0155008 A1 May 18, 2023

Related U.S. Application Data

(63) Continuation of application No. 17/170,263, filed on Feb. 8, 2021, now Pat. No. 11,557,659.
(Continued)

(51) Int. Cl.
*H01L 29/66* (2006.01)
*H01L 21/8234* (2006.01)
(Continued)

(52) U.S. Cl.
CPC ....... *H10D 30/024* (2025.01); *H10D 30/6211* (2025.01); *H10D 62/119* (2025.01);
(Continued)

(58) Field of Classification Search
CPC ....... H01L 21/02603; H01L 21/823431; H01L 21/823821; H01L 21/845; H01L 27/0886;
(Continued)

(56) References Cited

U.S. PATENT DOCUMENTS 9,660,033 B1 5/2017 Chen et al.
9,991,352 B1 * 6/2018 Frougier ........... H01L 29/42364
(Continued)

FOREIGN PATENT DOCUMENTS

CN 108122774 A 6/2018
CN 110875371 A 3/2020
(Continued)

*Primary Examiner* — David C Spalla
(74) *Attorney, Agent, or Firm* — HAYNES AND BOONE, LLP

(57) ABSTRACT

Embodiments of the present disclosure includes a semiconductor device. The semiconductor device includes first suspended nanostructures vertically stacked over one another and disposed on a substrate, a first gate stack engaging the first suspended nanostructures, a first gate spacer disposed on sidewalls of the first gate stack, second suspended nanostructures vertically stacked over one another and disposed on the substrate, a second gate stack engaging the second suspended nanostructures, and a second gate spacer disposed on sidewalls of the second gate stack. A middle portion of the first suspended nanostructures has a first thickness measured in a direction perpendicular to a top surface of the substrate. A middle portion of the second suspended nanostructures has a second thickness measured in the direction. The second thickness is smaller than the first thickness.

20 Claims, 34 Drawing Sheets

Related U.S. Application Data

(60) Provisional application No. 63/017,505, filed on Apr. 29, 2020.

(51) Int. Cl.
  *H01L 27/092* (2006.01)
  *H01L 29/06* (2006.01)
  *H01L 29/78* (2006.01)
  *H10D 30/01* (2025.01)
  *H10D 30/62* (2025.01)
  *H10D 62/10* (2025.01)
  *H10D 84/01* (2025.01)
  *H10D 84/03* (2025.01)
  *H10D 84/85* (2025.01)

(52) U.S. Cl.
  CPC ....... *H10D 84/0158* (2025.01); *H10D 84/038* (2025.01); *H10D 84/853* (2025.01)

(58) Field of Classification Search
  CPC ............. H01L 27/0924; H01L 27/1211; H01L 29/0665; H01L 29/0669; H01L 29/0673; H01L 29/41791; H01L 29/66439; H01L 29/66795; H01L 29/775; H01L 29/785; H01L 29/7851; H01L 29/7853; H01L 29/7855; H01L 2029/7858; H10D 30/014; H10D 30/024; H10D 30/62; H10D 30/6211; H10D 30/6735; H10D 62/118; H10D 62/119; H10D 62/121; H10D 84/0158; H10D 84/038; H10D 84/834; H10D 84/853

See application file for complete search history.

(56) References Cited

U.S. PATENT DOCUMENTS

| | | |
|---|---|---|
| 10,014,390 B1 | 7/2018 | Bouche et al. |
| 10,164,012 B2 | 12/2018 | Fung et al. |
| 10,714,592 B2 | 7/2020 | Cheng et al. |
| 11,557,659 B2* | 1/2023 | Wang ............. H01L 21/823807 |
| 2018/0114727 A1* | 4/2018 | Rodder .......... H01L 21/823828 |
| 2019/0189769 A1* | 6/2019 | Basker ................. H01L 29/167 |
| 2020/0075718 A1* | 3/2020 | Wang .................. H01L 29/0847 |
| 2020/0098756 A1* | 3/2020 | Lilak ................. H01L 29/66545 |
| 2020/0258995 A1* | 8/2020 | Bao ................. H01L 29/66439 |
| 2020/0287055 A1* | 9/2020 | Lee ...................... H01L 29/6681 |
| 2020/0357911 A1 | 11/2020 | Frougier et al. |
| 2021/0336038 A1* | 10/2021 | Zhang ............. H01L 29/78696 |

FOREIGN PATENT DOCUMENTS

| | | |
|---|---|---|
| CN | 110957223 A | 4/2020 |
| KR | 20150130984 A | 11/2015 |
| KR | 20150136355 A | 12/2015 |
| KR | 20180096828 A | 9/2018 |
| KR | 20190024625 A | 3/2019 |
| KR | 20200014235 A | 2/2020 |
| TW | 201913821 A | 4/2019 |

* cited by examiner

GATE ALL AROUND TRANSISTOR DEVICE AND FABRICATION METHODS THEREOF

PRIORITY

This is a continuation of U.S. patent application Ser. No. 17/170,263, filed Feb. 8, 2021, which claims priority to U.S. Prov. Pat. App. Ser. No. 63/017,505 filed Apr. 29, 2020, the entire content of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is nanosheet device, such as a gate-all-around (GAA) transistor, whose gate structure extends around its horizontal channel region providing access to the channel region on all sides. The nanosheet transistors are compatible with conventional complementary metal-oxide-semiconductor (CMOS) processes, allowing them to be aggressively scaled down while maintaining gate control and mitigating SCEs. However, it is difficult for conventional nanosheet devices to control its threshold voltage (Vt), due to issues such as smaller depletion region and smaller channel volume, and mobility degradation induced by heavy doping. Therefore, although conventional nanosheet devices have been generally adequate for their intended purposes, they are not satisfactory in every aspect.

BRIEF DESCRIPTION OF THE DRAWINGS

Aspects of the present disclosure are best understood from the following detailed description when read with the accompanying figures. It is emphasized that, according to the standard practice in the industry, various features are not drawn to scale. In fact, the dimensions of the various features may be arbitrarily increased or reduced for clarity of discussion.

DETAILED DESCRIPTION

Figure 1A:
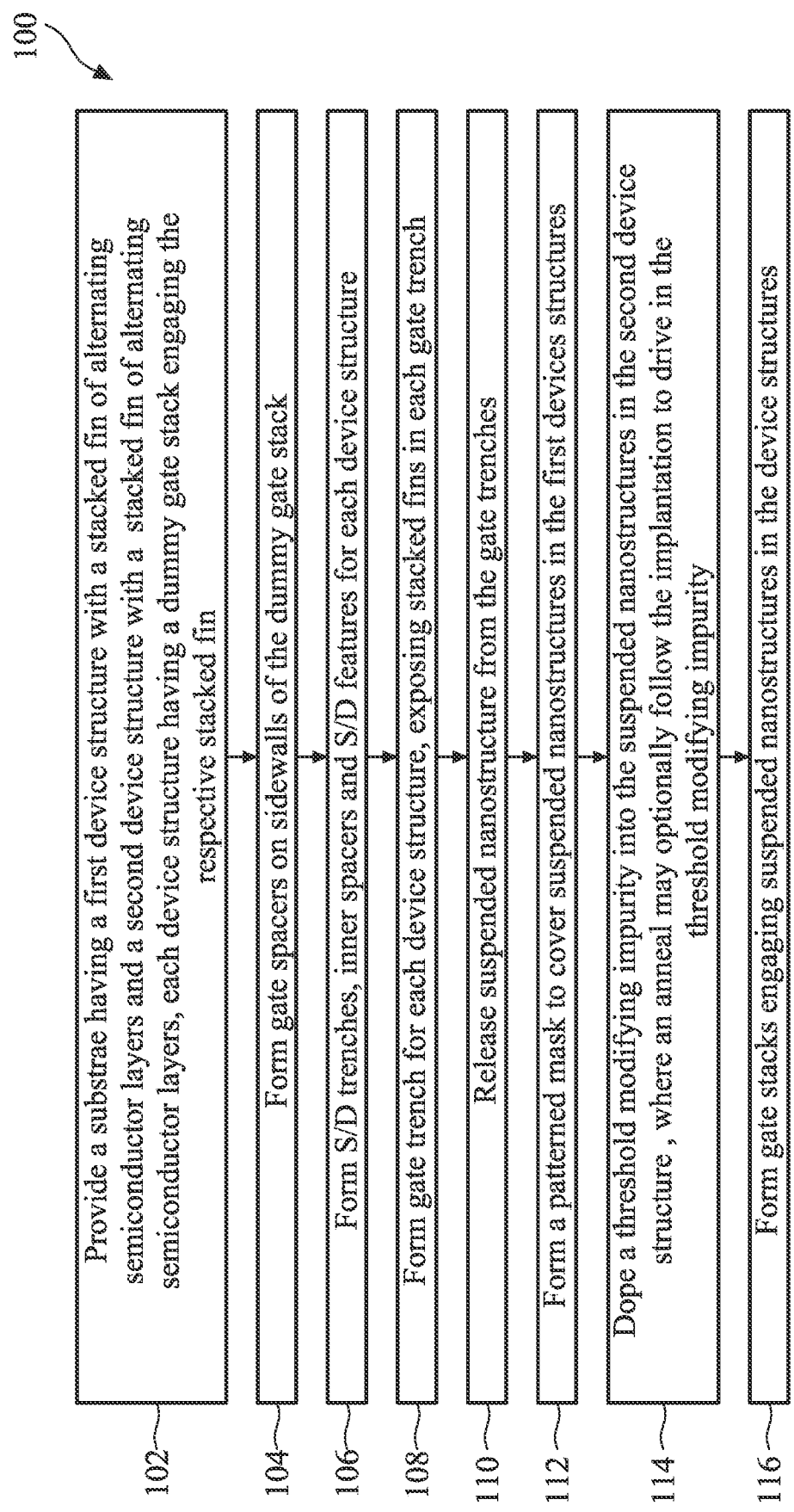
FIGS. 1A, 1B, and 1C are flow charts of methods of forming a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and methods of forming the same. More particularly, the present disclosure is related to threshold voltage (Vt) tuning in nanosheet devices, such as gate-all-around (GAA) devices.

A nanosheet device includes any device that has its gate structure, or portions thereof, formed on four-sides of a channel region (e.g., surrounding a portion of a channel region). It should be understood at the outset that the channel region of a nanosheet device may be formed from channel members such as nanosheets, as well as nanowires, nanobars, and/or other suitable structures. In some embodiments, the channel region of a nanosheet device has multiple horizontal nanowires, nanosheets, and/or nanobars vertically spaced, making the nanosheet device a stacked horizontal nanosheet device. The channel members may also be referred to as nanostructures (or suspended nanostructures) due to their nanoscale dimensions. The nanosheet devices presented herein include p-type metal-oxide-semiconductor nanosheet devices or n-type metal-oxide-semiconductor nanosheet devices. Further, the nanosheet devices have one or more channels (e.g., nanowires) associated with a single, contiguous gate structure, or multiple gate structures. One of ordinary skill may recognize other examples of semiconductor devices that may benefit from aspects of the present disclosure.

Presented herein are embodiments of nanosheet devices used to realize n-type and p-type transistors with vertically stacked n-type channels and p-type channels located on two close fins, which is often called complementary metal-oxide-semiconductor field-effect transistor (MOSFET) that uses complementary and symmetrical pairs of p-type and n-type transistors. Complementary MOSFET implemented by GAA devices are useful in many integrated circuits (ICs), but some methods of fabrication suffer from various problems as device sizes shrink. For instance, threshold voltage tuning for p-type transistors in the complementary transistor pairs becomes difficult due to issues such as smaller depletion region and smaller channel volume, and mobility degradation induced by heavy doping. Similarly, how to achieve different threshold voltages for p-type transistors in different regions (e.g., low Vt (LVt) region, standard Vt (SVt) region, and/or high Vt (HVt) region) remains as a challenge. Some methods require complicated metal work function scheme to tune threshold voltages for p-type transistors. However, such an approach often increases the difficulty of processes (e.g., difficult to deposit complicated metal work function layers in high-aspect-ratio gate trenches) and leads to defects.

The present disclosure addresses the above problems by providing improved methods of forming nanosheet transistors on multiple fins. According to some embodiments, after forming suspended nanostructures of a first fin for an n-type GAA transistor and suspended nanostructures of a second fin for a p-type GAA transistor, a method implants a threshold modifying impurity into the suspended nanostructures of the p-type GAA transistor. In some embodiments, the threshold modifying impurity is germanium (Ge). The implantation of the threshold modifying impurity forms distinctive distribution within the p-type channel. Further, critical dimensions (CDs) of the suspended nanostructures for the p-type GAA transistor can be trimmed to adjust threshold voltage. The CDs trimming and the threshold modifying impurity doping can be combined to achieve a wider tuning range of threshold voltages. The various methods in the embodiments of the present disclosure can be applied to every p-type FET region in an IC to achieve a same threshold voltage adjustment, or to specific p-type FET regions to achieve multiple threshold voltages in different regions, such as forming LVt regions, SVt regions, and/or HVt regions. As a result, threshold voltage tuning in p-type GAA transistors can be achieved with a simplified fabrication process.

Figure 2:
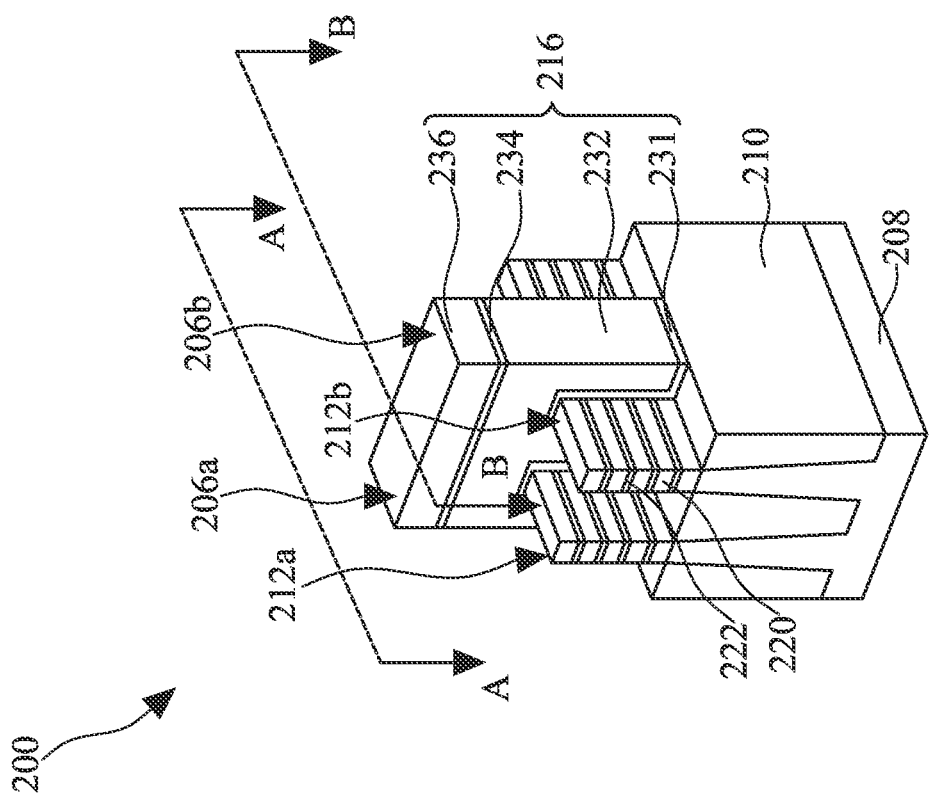
FIGS. 2, 13, and 23 are perspective views of a semiconductor structure provided according to various aspects of the present disclosure.
Figure 12:
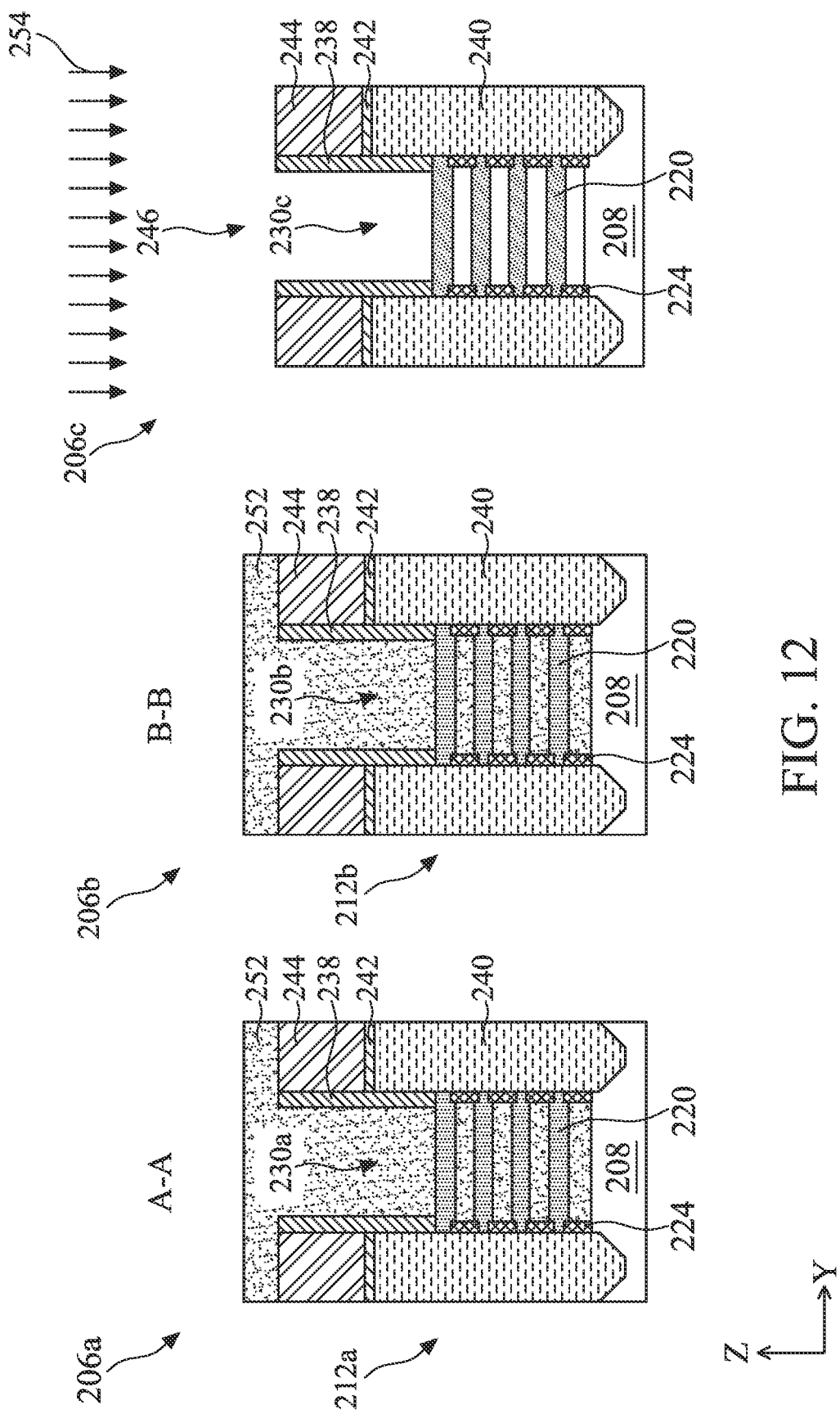

FIG. 1A is a flowchart of a method 100 of forming a semiconductor device 200 (also referred to as device 200), according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. Some embodiments of method 100 are described below in conjunction with FIGS. 2-12. FIG. 2 is a perspective view of the device 200. FIGS. 3-12 are cross-sectional views (listed side-by-side) of the device 200 along the A-A cut and B-B cut as shown in FIG. 2, which pass the respective channel regions along the lengthwise direction of the transistors (in Y-Z plane). A cross-sectional view passing a channel region along the lengthwise direction of an additional p-type GAA transistor of the device 200 is also depicted in FIG. 12.

At operation 102, the method 100 (FIG. 1A) provides the device 200 that includes a first device structure 206a and a second device structure 206b, as shown in FIG. 2. Each of the device structures 206a and 206b includes the substrate 208, the isolation structure 210, the fin 212a or 212b that comprises alternating semiconductor layers 220 and 222 vertically stacked (also refer to as stacked fin 212a or 212b), and a dummy gate structure 216 engaging the stacked fins 212a and 212b. As explained in greater detail below, an example n-type GAA transistor will be formed from the first device structure 206a and an example p-type GAA transistor will be formed from the second device structure 206b. The device 200 is provided for illustration purposes and does not necessarily limit the embodiments of the present disclosure to any number of devices, any number of regions, or any configuration of structures or regions. Furthermore, the device 200 is an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

In some embodiments, the substrate 208 includes silicon. Alternatively or additionally, substrate 208 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 208 includes one or more group III-V materials, one or more group II-IV materials, or combinations thereof. In some implementations, the substrate 208 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 208 can include various doped regions configured according to design requirements of semiconductor device 200. P-type doped regions may include p-type dopants, such as boron, indium, other p-type dopant, or combinations thereof. N-type doped regions may include n-type dopants, such as phosphorus, arsenic, other n-type dopant, or combinations thereof. In some implementations, the substrate 208 includes doped regions formed with a combination of p-type dopants and n-type dopants. The various doped regions can be formed directly on and/or in substrate 208, for example, providing a p-well structure, an n-well structure, a dual-well structure, a raised structure, or combinations thereof. An ion implantation process, a diffusion process, and/or other suitable doping process can be performed to form the various doped regions. In some embodiments, p-type GAA devices and p-type FinFET devices are formed over n-type wells, while n-type GAA devices and n-type FinFET devices are formed over p-type wells. Each of the device structures 206a and 206b may individually be an n-type or a p-type device.

The isolation structure 210 may comprise silicon oxide, silicon nitride, silicon oxynitride, fluoride-doped silicate glass (FSG), a low-k dielectric material, and/or other suitable insulating material. The isolation structure 210 may be shallow trench isolation (STI) features. Other isolation structure such as field oxide, LOCal Oxidation of Silicon (LOCOS), and/or other suitable structures are possible. The isolation structure 210 may include a multi-layer structure, for example, having one or more thermal oxide liner layers.

Each of the stacked fins 212a and 212b has a stack of semiconductor layers 220 and 222 in an interleaving or alternating fashion (e.g., a semiconductor layer 220 disposed over a semiconductor layer 222, then another semiconductor layer 222 disposed over the semiconductor layer 220, and so on). In some embodiments, the semiconductor layers 220 and 222 are alternatingly disposed in a vertical direction, forming a semiconductor stack. In various embodiments, the stack includes any number of alternately disposed semiconductor layers 220 and 222. In some embodiments, the semiconductor layers 220 and 222 have different thicknesses. Further, the semiconductor layers 220 may have different thicknesses from one layer to another layer, and the semiconductor layers 222 may have different thicknesses from one layer to another layer. In some embodiments, the thickness of each of the semiconductor layers 220 and 222 ranges from several nanometers to tens of nanometers. In an embodiment, each semiconductor layer 220 has a thickness ranging from about 5 nm to about 10 nm, and each semiconductor layer 222 has a thickness ranging from about 5 nm to about 10 nm.

The two types of semiconductor layers 220 and 222 have different compositions. In various embodiments, the semiconductor layers 222 have compositions that provide for different oxidation rates and/or different etch selectivity from the semiconductor layers 220. In an embodiment, the semiconductor layers 222 include silicon germanium ($Si_{1-x}Ge_x$), while the semiconductor layers 220 include silicon (Si). In an embodiment, each semiconductor layer 220 is silicon undoped or substantially dopant-free (i.e., having an extrinsic dopant concentration from about 0 $cm^{-3}$ to about $1 \times 10^{17}$ $cm^{-3}$), where no intentional doping is performed when forming the semiconductor layer 220 (e.g., of silicon). Alternatively, each semiconductor layer 220 is intentionally doped. In an example, the semiconductor layer 220 is made of silicon doped with either a p-type dopant such as boron (B), aluminum (Al), indium (In), and gallium (Ga), or an n-type dopant such as phosphorus (P), arsenic (As), antimony (Sb). In some embodiments, each semiconductor layer 222 is $Si_{1-x}Ge_x$ that includes less than 50% (x<0.5) Ge in molar ratio. For example, Ge comprises about 15% to about 35% of the semiconductor layer 222 of $Si_{1-x}Ge_x$ in molar ratio. Further, the semiconductor layers 222 may include different compositions among them, and the semiconductor layers 220 may include different compositions among them.

In various embodiments, either of the semiconductor layers 220 and 222 includes other materials such as a compound semiconductor (e.g., silicon carbide, gallium arsenide, gallium phosphide, indium phosphide, indium arsenide, and/or indium antimonide), or an alloy semiconductor (e.g., GaAsP, AlInAs, AlGaAs, InGaAs, GaInP, and/or GaInAsP), or combinations thereof. The materials of the semiconductor layers 220 and 222 may be chosen based on providing differing oxidation rates and/or etch selectivity. The semiconductor layers 220 and 222 may be doped or undoped, as discussed above.

In some embodiments, the semiconductor layers 220 and 222 are epitaxially grown layer-by-layer from a top surface of the substrate 208. In an example, each of the semiconductor layers 220 and 222 are grown by a molecular beam epitaxy (MBE) process, a chemical vapor deposition (CVD) process such as a metal organic CVD (MOCVD) process, and/or other suitable epitaxial growth processes. During the epitaxial growth, the crystalline structure of the substrate 208 extends upwardly, resulting in the semiconductor layers 220 and 222 having the same crystal orientation with the substrate 208.

The stacked fins 212a and 212b can be formed by epitaxially growing the semiconductor layers 220 and 222 over the substrate 208 and then patterned by any suitable method to form the individual stack fins 212a and 212b. For example, the stacked fins 212a and 212b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the stacked fins 212a and 212b by etching the initial semiconductor layers 220, 222 and the substrate 208. The etching process can include dry etching, wet etching, reactive ion etching (RIE), and/or other suitable processes. In the illustrated embodiment, stacked fins 212a and 212b extend lengthwise in the same direction (longitudinal axes are parallel).

The dummy gate structure 216 reserves an area for a metal gate stack and includes a dummy interfacial layer 231, a dummy gate electrode 232, a first gate hard mask layer 234, and a second gate hard mask layer 236. The dummy interfacial layer 231 is formed over top and sidewall surfaces of each of the stacked fins 212a and 212b and over the top surface of the isolation structure 210. The dummy interfacial layer 231 may include a dielectric material such as an oxide layer (e.g., $SiO_2$) or oxynitride layer (e.g., SiON), and may be deposited by chemical oxidation, thermal oxidation, atomic layer deposition (ALD), chemical vapor deposition (CVD), and/or other suitable methods.

The dummy gate electrode 232 may include poly-crystalline silicon (poly-Si) and may be formed by suitable deposition processes such as low-pressure chemical vapor deposition (LPCVD) and plasma-enhanced CVD (PECVD). Each of the gate hard mask layers 234 and 236 may include one or more layers of dielectric material such as silicon oxide and/or silicon nitride, and may be formed by CVD or other suitable methods. For example, the first gate hard mask layer 234 may include a silicon oxide layer adjacent the dummy gate electrode 232 and the second gate hard mask layer 236 may include a silicon nitride layer. The various layers 231, 232, 234, and 236 may be patterned by photolithography and etching processes.

Figure 3:
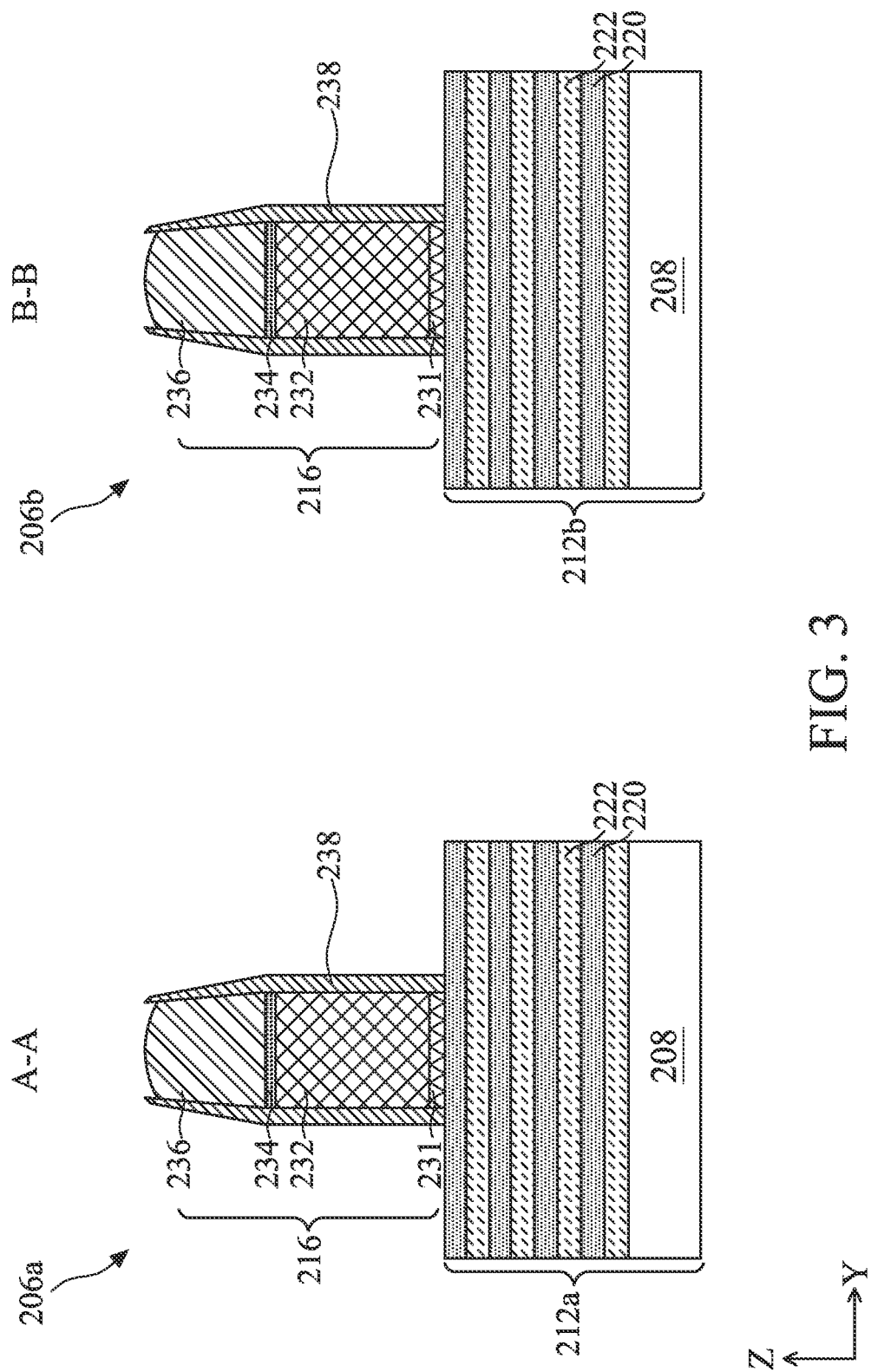
FIGS. 3, 4, 5, 6, 7, 8, 9, 10, 11, 12, 14, 15, 16, 17, 18, 19, 20, 21, 22, 24, 25, 26, 27, 28, 29, 30, 31, and 32 are cross-sectional views of a semiconductor device, at various fabrication stages, constructed according to the respective methods in FIGS. 1A-1C, according to some embodiments of the present disclosure.

At operation 104, the method 100 (FIG. 1A) forms the gate spacers 238 over the sidewalls of the dummy gate structure 216, as shown in FIG. 3. The gate spacers 238 may comprise a dielectric material, such as silicon oxide, silicon nitride, silicon oxynitride, silicon carbide, other dielectric material, or combinations thereof, and may comprise one or multiple layers of material. The gate spacers 238 may be formed by depositing a spacer material as a blanket over the device 200. Then the spacer material is etched by an anisotropic etching process. Portions of the spacer material on the sidewalls of the dummy gate structure 216 become the gate spacers 238.

Figure 4:
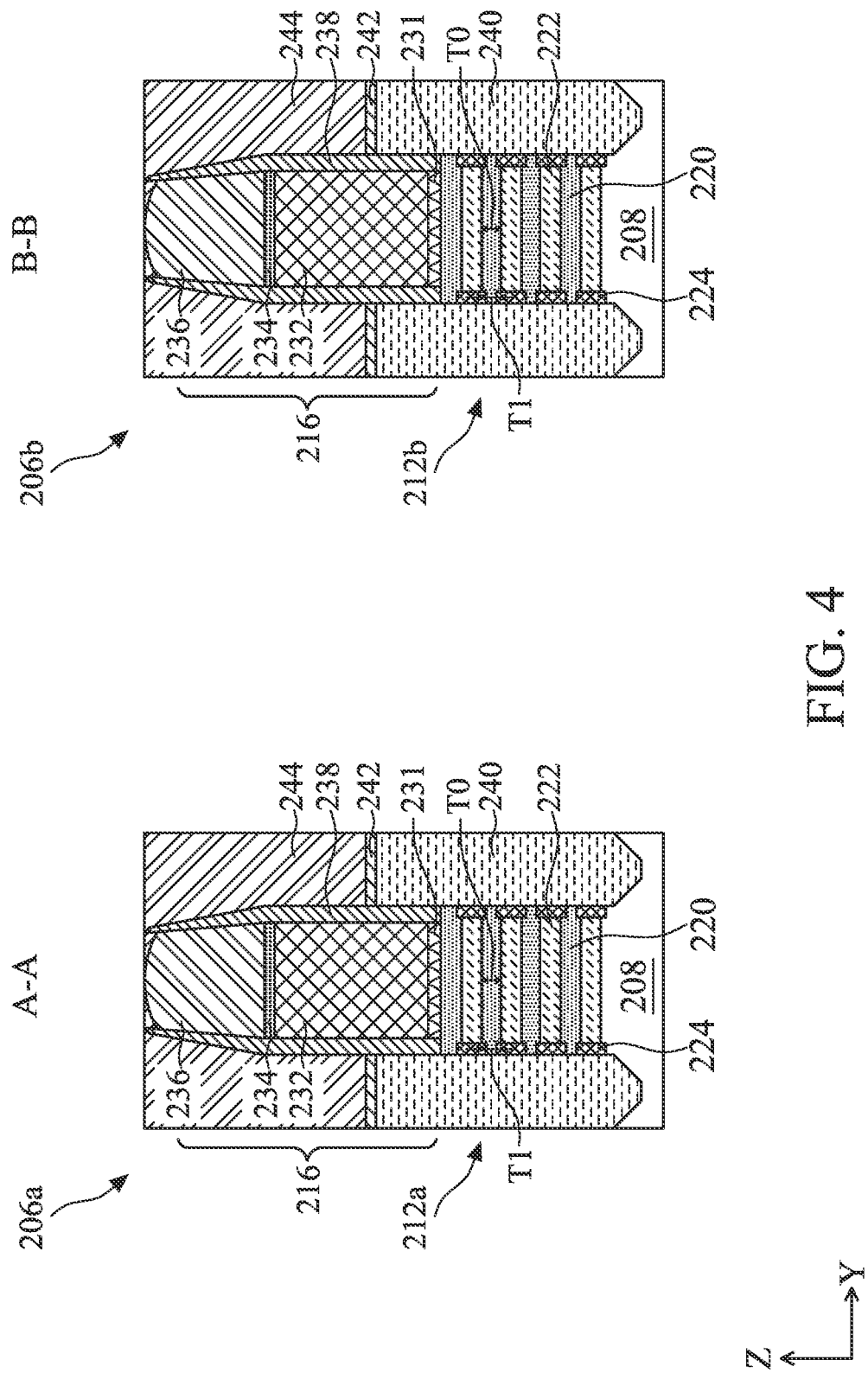

At operation 106, the method 100 (FIG. 1A) recesses the stacked fins 212a and 212b at the S/D regions, by using one or more lithography and etching operations, thereby forming S/D trenches. In some embodiments, the substrate 208 is also partially etched. At this stage, end portions (also referred to as lateral ends) of the stacked semiconductor layers 220 and 222 are exposed in the S/D trenches. The method 100 at operation 106 further laterally etches the semiconductor layers 222 in the Y direction through the S/D trenches, thereby forming cavities. The amount of etching of the first semiconductor layer 222 is in a range from about 2 nm to about 5 nm in some embodiments. When the semiconductor layers 222 are Ge or SiGe and the semiconductor layers 220 are Si, the semiconductor layers 222 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. The lateral etching of the semiconductor layers 222 may also remove a small portion of the semiconductor layers 220. As a result, a thickness T1 of the lateral ends of the semiconductor layers 220 is smaller than thickness T0 of other portions of the semiconductor layers 220 that are under the sacrificial gate structure, such as shown in FIG. 4. Inner spacers 224 are subsequently formed in the cavities adjacent lateral ends of the semiconductor layers 222. In some embodiments, the inner spacers 224 includes a dielectric material, such as SiN, SiOC, SiOCN, SiCN, $SiO_2$, and/or other suitable material, such as a low-k dielectric material with a dielectric constant less than about 3.9.

Operation 106 further forms S/D features 240 in the S/D regions, as shown in FIG. 4. For example, operations 106 may epitaxially grow semiconductor materials in the S/D trenches. The semiconductor materials may be raised above the top surface of the respective stacked fins. Operation 106 may form the S/D features 240 separately for n-type and p-type devices. For example, Operation 106 may form the S/D features 240 with an n-type doped silicon for n-type devices, and with a p-type doped silicon germanium for p-type devices. Operation 106 may further form contact etch stop (CESL) layer 242 over the S/D features 240 and inter-layer dielectric (ILD) layer 244 over the CESL layer 242. The CESL layer 242 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD or FCVD (flowable CVD), or other suitable methods. A CMP process may follow operation 106 to remove excessive dielectric materials. In some embodiments, the CMP process also removes the gate hard masks 234 and 236 and exposes the dummy gate electrode 232.

Figure 5:
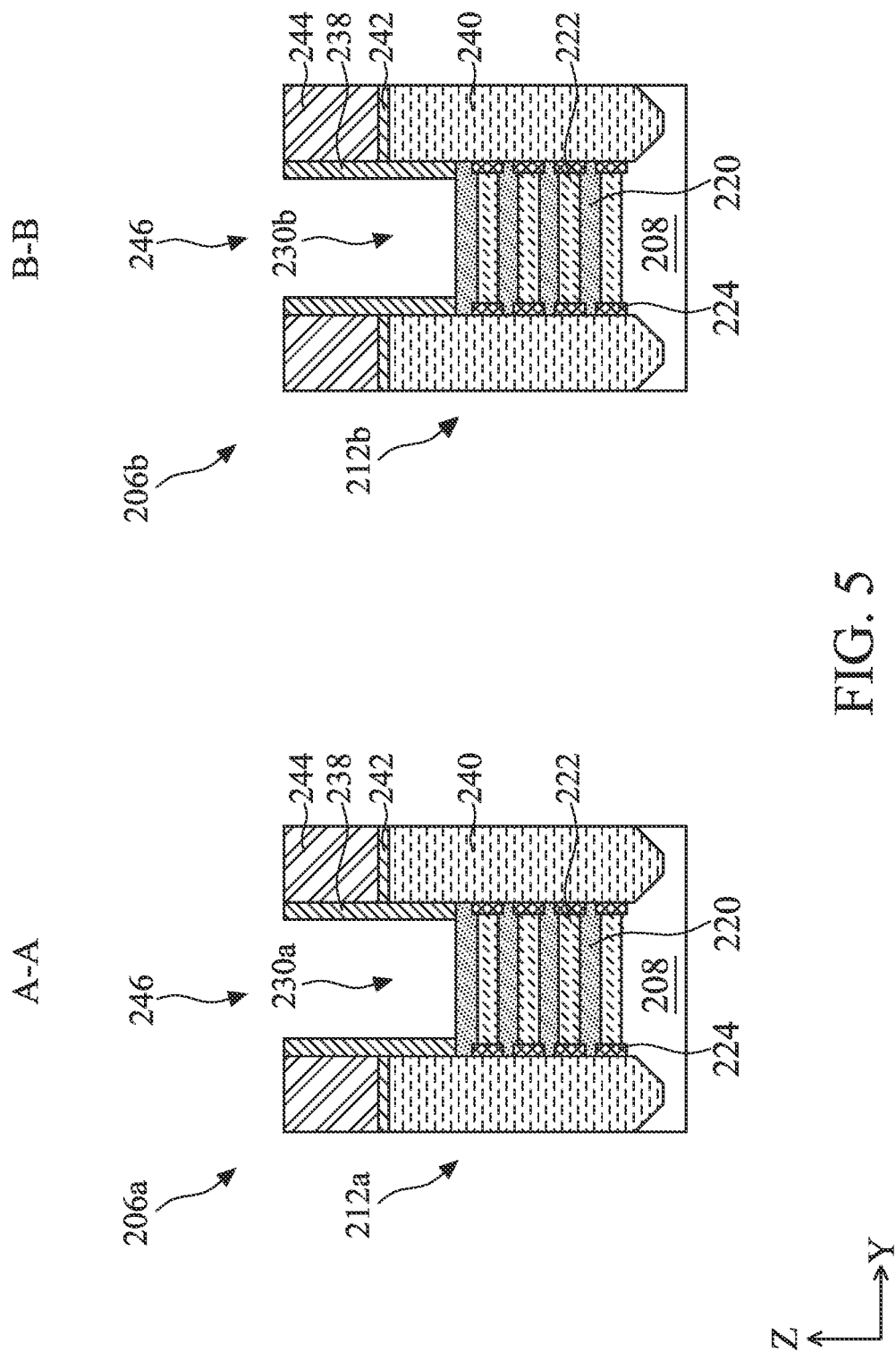
Figure 6:
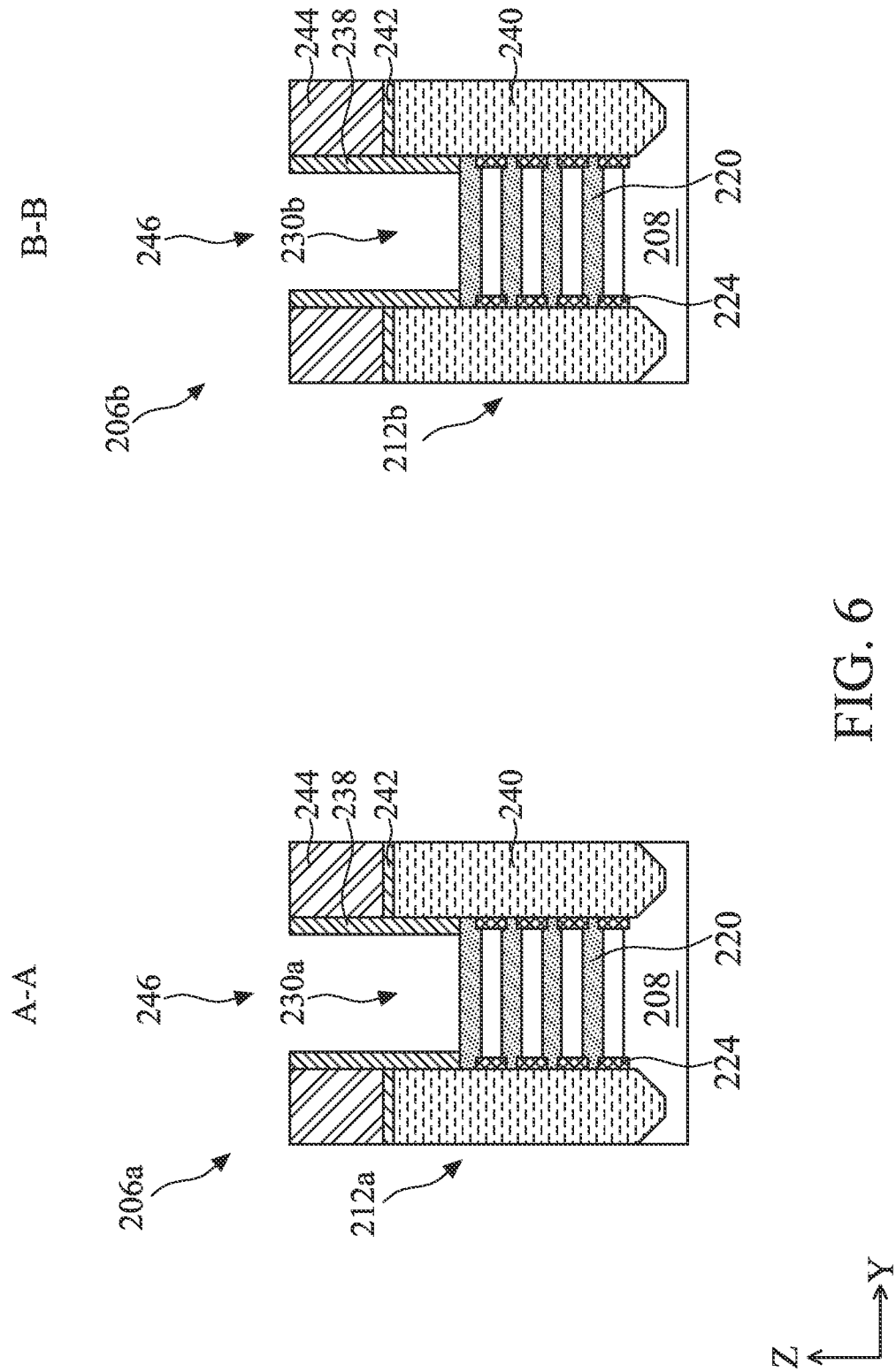

At operation 108, the method 100 (FIG. 1A) removes the dummy gate stack 216 to form gate trenches 246, as shown in FIG. 5. Channel regions, such as the n-type channel region 230a of the first device structure 206a and the p-type channel region 230b of the second device structure 206b are exposed in the gate trenches 246. Operation 108 may include one or more etching processes that are selective to the material in the dummy gate structure 216. By selecting an etchant that resists etching the gate spacers 238 and ILD layer 244, portions of the gate spacers 238 and ILD layer 244 adjacent to the dummy gate structure 216 are exposed in the gate trenches 246 without substantial etching loss. The etching process may include any suitable etching technique such as wet etching, dry etching, RIE, ashing, and/or other etching methods. In an example, the etching process is a dry etching process using a fluorine-based etchant (e.g., $CF_4$, $CHF_3$, $CH_2F_2$, etc.).

At operation 110, the method 100 (FIG. 1A) releases suspended nanostructures (e.g., nanowire or nanosheet) in the exposed channel regions. The formation of suspended nanostructures includes a selective etching process to selectively remove semiconductor layers 222 from the respective channel region of the FETs. Referring to the example of FIG. 6, the semiconductor layers 222 (e.g., $Si_{1-x}Ge_x$) are removed from the channel regions of the stacked fins 212a and 212b, while the semiconductor layers 220 (e.g., Si) substantially remain as the channel layers. In other words, in the channel regions 230a and 230b, the semiconductor layers 220 are removed. As a result, portions of the semiconductor layers 220 in the channel regions 230a and 230b are suspended in the respective openings. Therefore, after operation 110, the semiconductor layers 220 are also called suspended nanostructures 220.

In an embodiment, the semiconductor layers to be removed are etched by a selective wet etching process while the other semiconductor layers with different composition remain substantially unchanged. In some embodiments, the selective wet etching process includes a hydro fluoride (HF) or $NH_4OH$ etchant. In an embodiment where the semiconductor layers 222 includes SiGe and the semiconductor layers 220 includes Si, the selective removal of the SiGe layers 222 includes a SiGe oxidation process followed by a $SiGeO_x$ removal. In an example, the SiGe oxidation process includes forming and patterning various masking layers such that the oxidation is controlled to the SiGe layers 222. In other embodiments, the SiGe oxidation process is a selective oxidation due to the different compositions of the semiconductor layers 220 and 222. In some examples, the SiGe oxidation process is performed by exposing the device 200 to a wet oxidation process, a dry oxidation process, or a combination thereof. Thereafter, the oxidized semiconductor layers 222, which include $SiGeO_x$, are removed by an etchant such as $NH_4OH$ or diluted HF. The semiconductor layer can be also removed by a selective dry etching process while other semiconductor layers with different composition remain substantially unchanged. In some embodiments, the selective dry etching process includes a hydro fluoride (HF), fluoride ($F_2$), Carbon fluoride ($CF_x$), hydrogen ($H_2$)-based etchant.

Threshold voltage of n-type FETs can be set by metal work function layers. To achieve proper threshold voltage p-type FETs, the method 100 then proceeds to tweak the channel region 230b of the second device structure 206b in order to fine tune threshold voltage of the to-be-formed p-type FET. The tweaking in the channel region 230b includes various procedures and operations, such as operations 112 and 114, which are described next.

Figure 7:
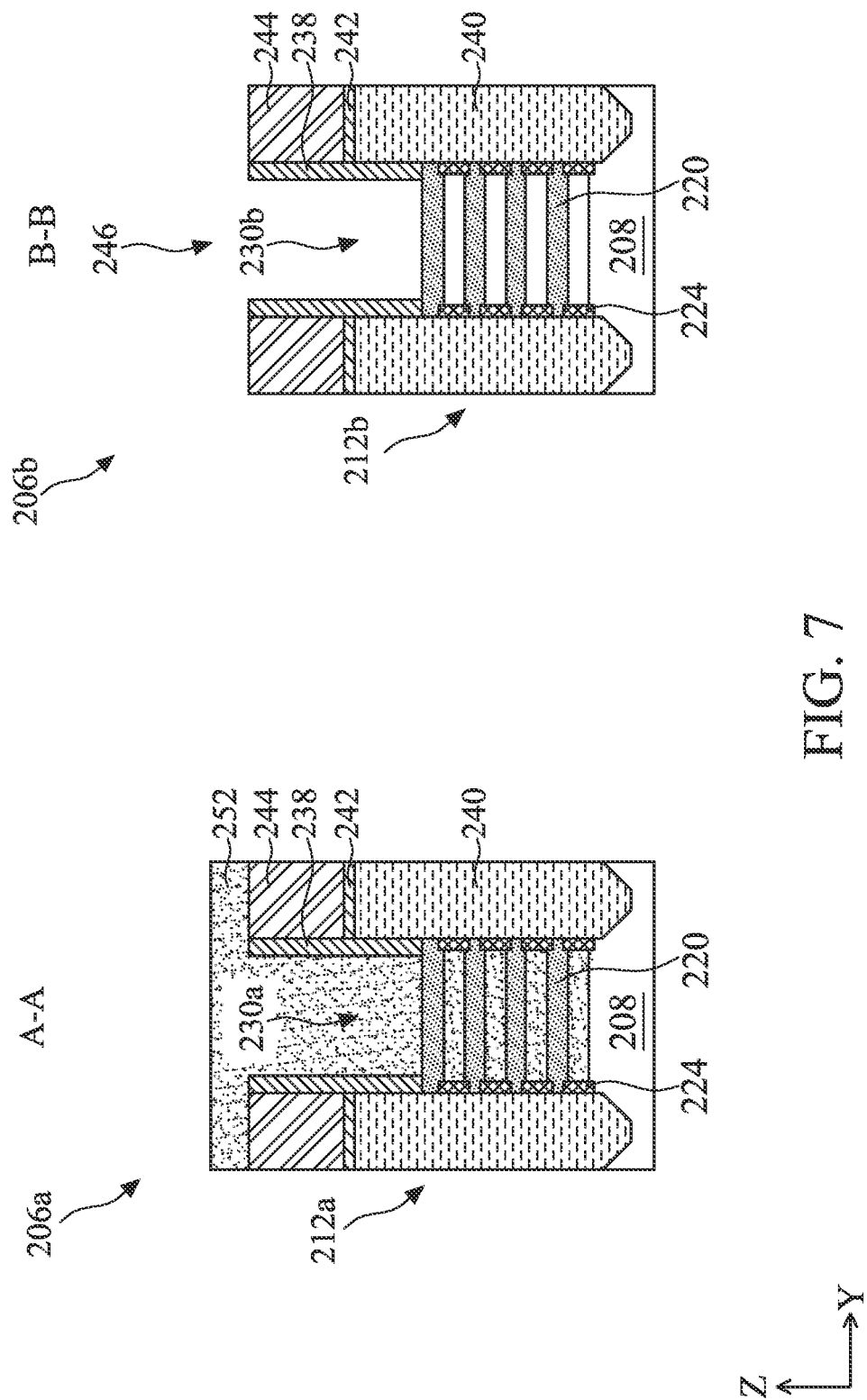

At operation 112, the method 100 (FIG. 1A) forms a patterned mask on the top surface of the device 200. As shown in FIG. 7, the patterned mask covers the first device structure 206a and includes an opening that exposes the second device structure 206b. In one embodiment, the patterned mask includes a hard mask 252 (instead of a soft mask such as a patterned resist layer) disposed on the first device structure 206a. In some examples, the hard mask 252 includes silicon oxide, silicon nitride, silicon oxynitride, silicon carbide, silicon carbide nitride, silicon carbide oxynitride, other semiconductor material, and/or other dielectric material. In an embodiment, the hard mask 252 has a thickness ranging from about 1 nm to about 40 nm. The hard mask 252 is formed by thermal oxidation, chemical vapor deposition (CVD), atomic layer deposition (ALD), or any other appropriate method. The hard mask 252 is patterned using any suitable methods such as a photolithography process, which may include forming a resist layer on the hard mask 252, exposing the resist by a lithography exposure process, performing a post-exposure bake process, developing the photoresist layer to form the patterned photoresist layer that exposes part of the hard mask 252, patterning the hard mask 252, and finally removing the patterned resist layer. The lithography process may be alternatively replaced by other suitable techniques, such as e-beam writing, ion-beam writing, maskless patterning or molecular printing.

At operation 114, the method 100 (FIG. 1A) dopes a threshold modifying impurity into the channel region 230b to adjust threshold voltage of the second device structure 206b. In some embodiments, the threshold modifying impurity include germanium. In one example, where the suspended nanostructures 220 are formed in a silicon material, the germanium dopant may form a dipole with the silicon material. The dipole formation may be used to tune a threshold voltage of a FET transistor that is formed using the suspended nanostructures 220 as channel layers. In one example, the threshold voltage of the FET transistor may be changed by controlling a dosage of the germanium concentration in the suspended nanostructures 220, where a magnitude of the change in the threshold voltage may be proportional to the dosage. For example, when the to-be-formed FET transistor is a p-type FET, the germanium dopant implantation may reduce the threshold voltage of the field effect transistor, such that a higher dosage causes a greater reduction of the threshold voltage.

Figure 8:
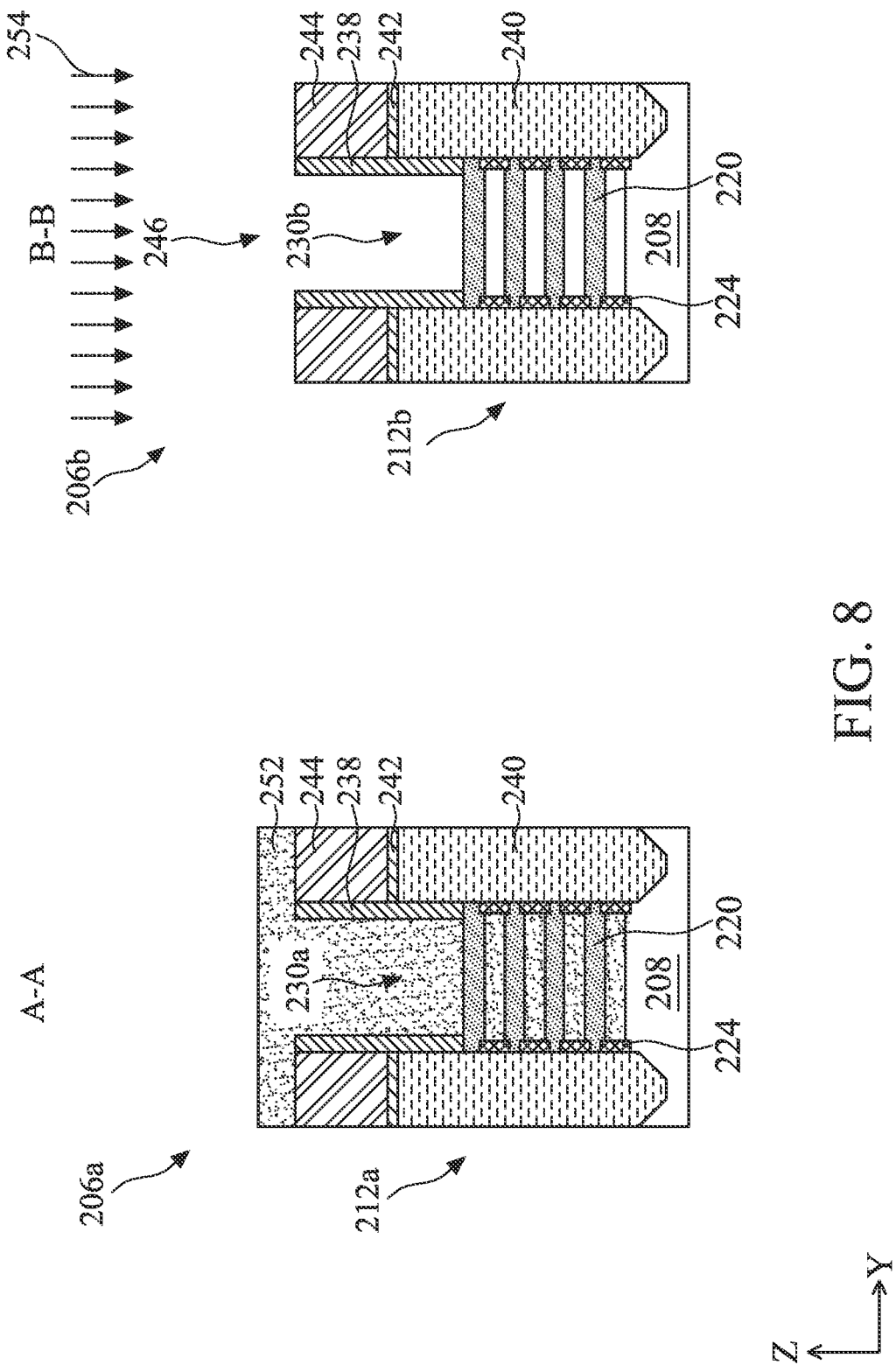

In one embodiment of operation 114, the doping of threshold modifying impurity includes a germanium implantation process 254, as shown in FIG. 8. The implantation process may be performed at an energy of between approximately 0.5 keV and approximately 30 keV. In an embodiment, the implantation process is a substantially vertical implant (e.g., perpendicular to a top surface of the substrate). In an embodiment, the implantation process is a tilted implantation. The tilt angle may be between approximately 0 degrees and approximately 30 degrees. The dosages of the implanted germanium vary between about $1\times10^{15}/cm^2$ and about $5\times10^{15}/cm^2$, and the threshold voltages of the p-type FET may be decreased by about 10 mV to about 120 mV proportionally. The germanium implantation may be performed at an elevated temperature (e.g., greater than 400° C.) to prevent amorphization of the suspended nanostructure 220 during the implantation. For example, an atmosphere in which the germanium implantation occurs may be heated to a temperature of greater than approximately 450° C., and the device 200 itself (e.g., including the substrate 208) may be heated to a temperature of greater than approximately 400° C. during the germanium implantation. In another embodiment, the doping of germanium includes a low-temperature plasma doping process, which drives germanium ion into the suspended nanostructures 220. In one example, the plasma doping process is performed having an RF source less than about 1000 W at approximately 2 MHz and a pulsed DC bias less than about 10 KV at approximately 0.5-10 KHz, and under a pressure from about 6 mTorr to about 200 mTorr and at a temperature less than approximately 100° C.

Figure 9:
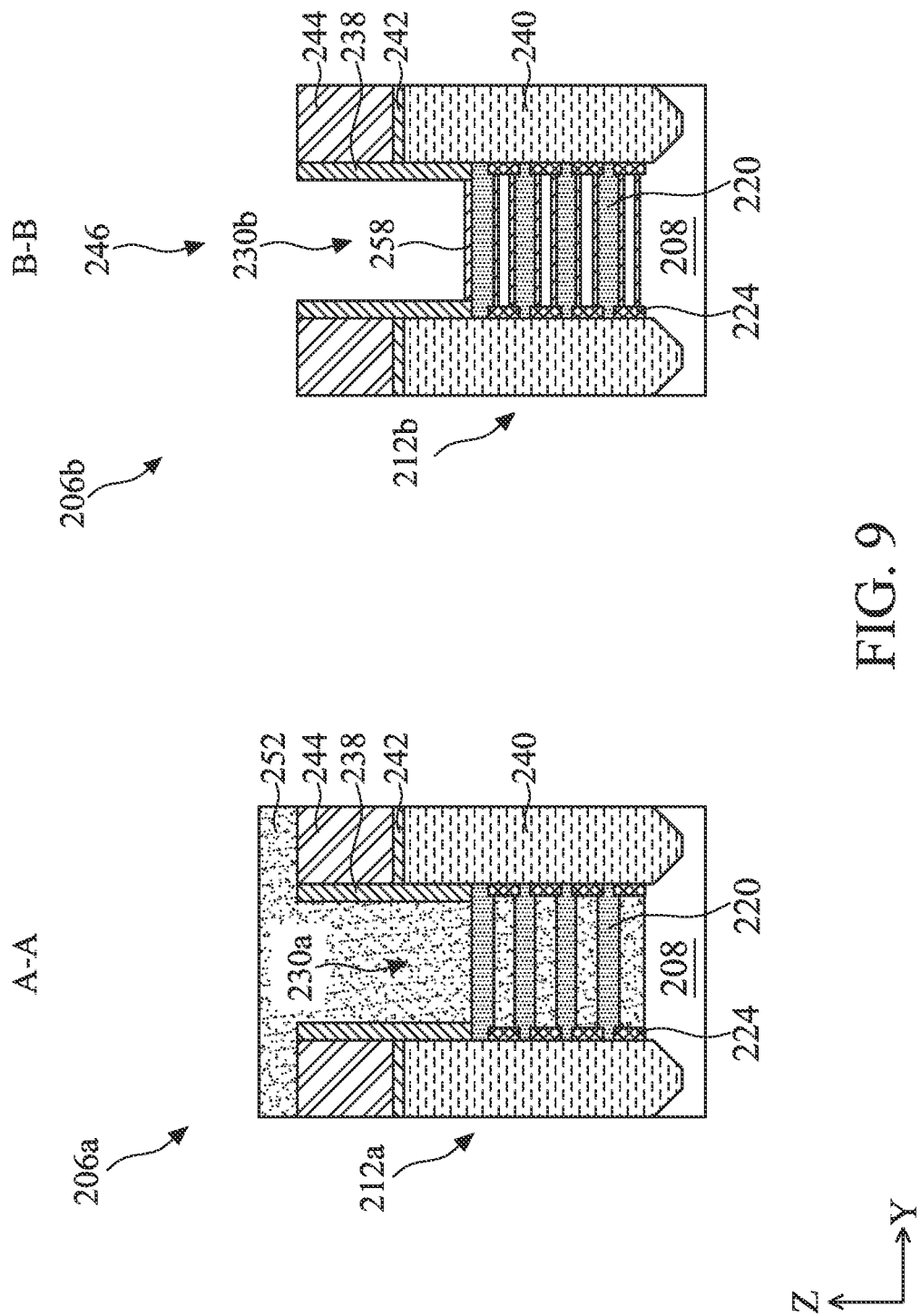

In yet another embodiment of operation 114, the method 200 forms a semiconductor layer 258 around each of the suspended nanostructures 220 located in the second device structure 206b (but not those in the first device structure 206a), as shown in FIG. 9. The semiconductor layers 258 contains the threshold modifying impurity and has different compositions from the suspended nanostructures 220. In an embodiment, the semiconductor layers 258 include silicon germanium ($Si_{1-x}Ge_x$), while the suspended nanostructures 220 include silicon (Si). For example, each layer 258 is $Si_{1-x}Ge_x$ that includes about 10% to about 100% (0.1≤x≤1) Ge in molar ratio. In another embodiment, the semiconductor layers 258 include germanium tin ($Ge_xSn_{1-x}$), while the suspended nanostructures 220 include silicon (Si). For example, each layer 258 is $Ge_xSn_{1-x}$ that includes about 10% to about 100% (0.1≤x≤1) Ge in molar ratio. A sufficient amount of Ge in each layer 258 helps reducing a threshold voltage of the channel region 230b in the second device structure 206b. For example, Ge may comprise about 60% to about 80% of the layer 258 of $Si_{1-x}Ge_x$ or $Ge_xSn_{1-x}$ in molar ratio. Such a range of Ge, combined with subsequent processing steps, effectively reduce threshold voltage of the channel region 230b of the second device structure 206b. Further, the semiconductor layers 258 may include other different compositions among them.

Still referring to FIG. 9, in some embodiments, the semiconductor layers 258 are epitaxially grown from the surfaces of the semiconductor layers 220. For example, each semiconductor layer 258 is grown by an MBE process, a CVD process such as a MOCVD process, and/or other suitable epitaxial growth processes. The epitaxial growth approach allows materials in the semiconductor layer 258 to form crystalline lattices that are consistent with those of the semiconductor layers 220. In some embodiments, each semiconductor layer 258 is a conformal layer that has a substantially uniform thickness. In one example, each semiconductor layer 258 has a thickness of about 1 nm to about 4 nm. In some embodiments, a thickness ratio between a semiconductor layer 258 and its surrounded semiconductor layer 220 is about 1:4 to about 1:2. In other words, the semiconductor layer 258 is thinner than its corresponding semiconductor layer 220. Such a thickness ratio provides suitable amount of germanium needed for threshold adjustment.

As shown in FIG. 9, each semiconductor layer 220 includes a middle section exposed in the gate trench 246 and two end sections under the gate spacers 238. The middle section is suspended in space (and to be wrapped around by a metal gate stack in subsequent steps), and the end sections are engaged (e.g., surrounded or wrapped around) by the inner spacers 224 and gate spacers 238. In an embodiment, since only middle sections are exposed, the semiconductor layers 258 are epitaxially grown only in the middle sections, and not in the end sections of the suspended nanostructures 220. In other words, the semiconductor layers 258 are only formed at the gate contact region and stop at the gate spacers 238 and the inner spacers 224.

Figure 10:
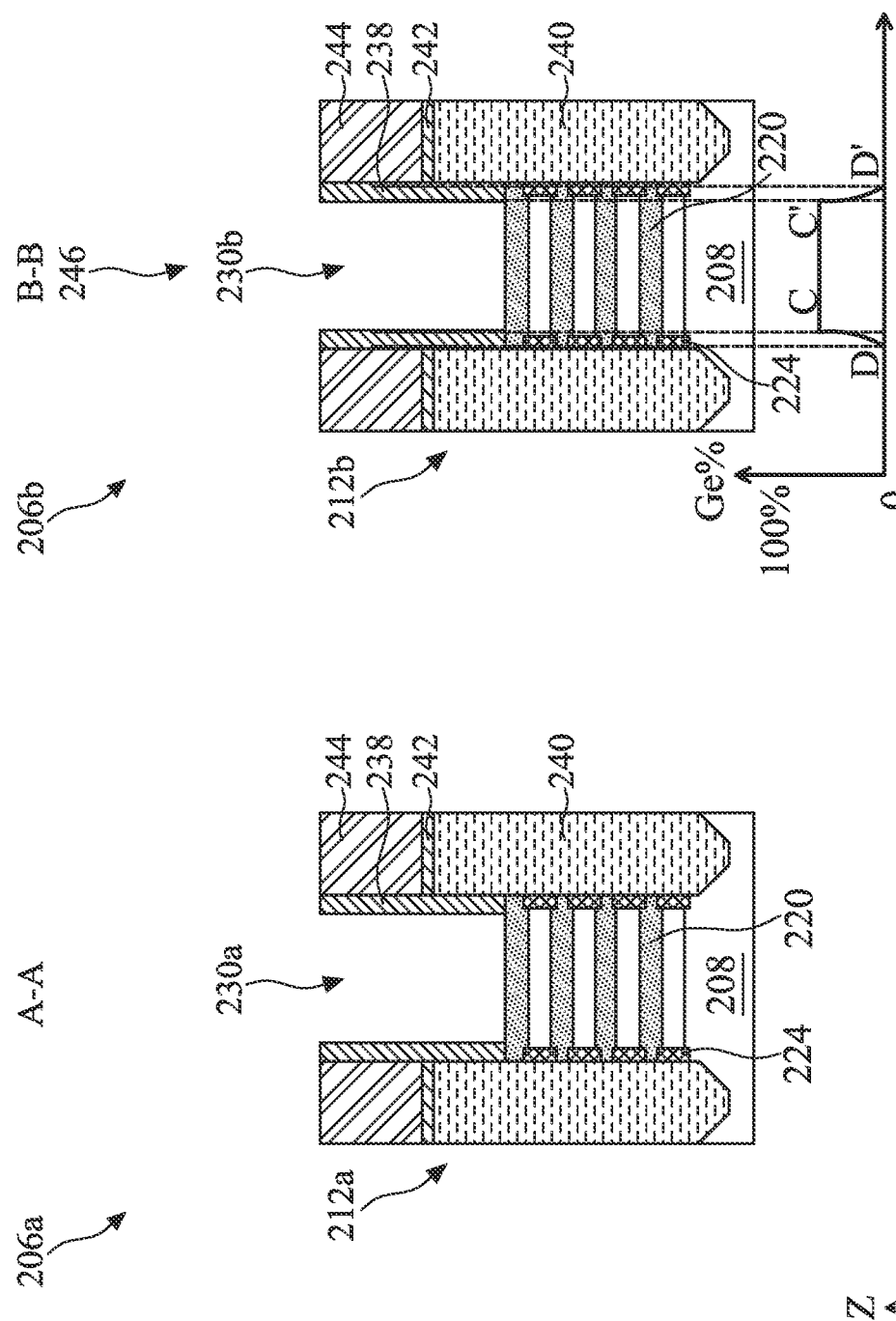
Figure 11:
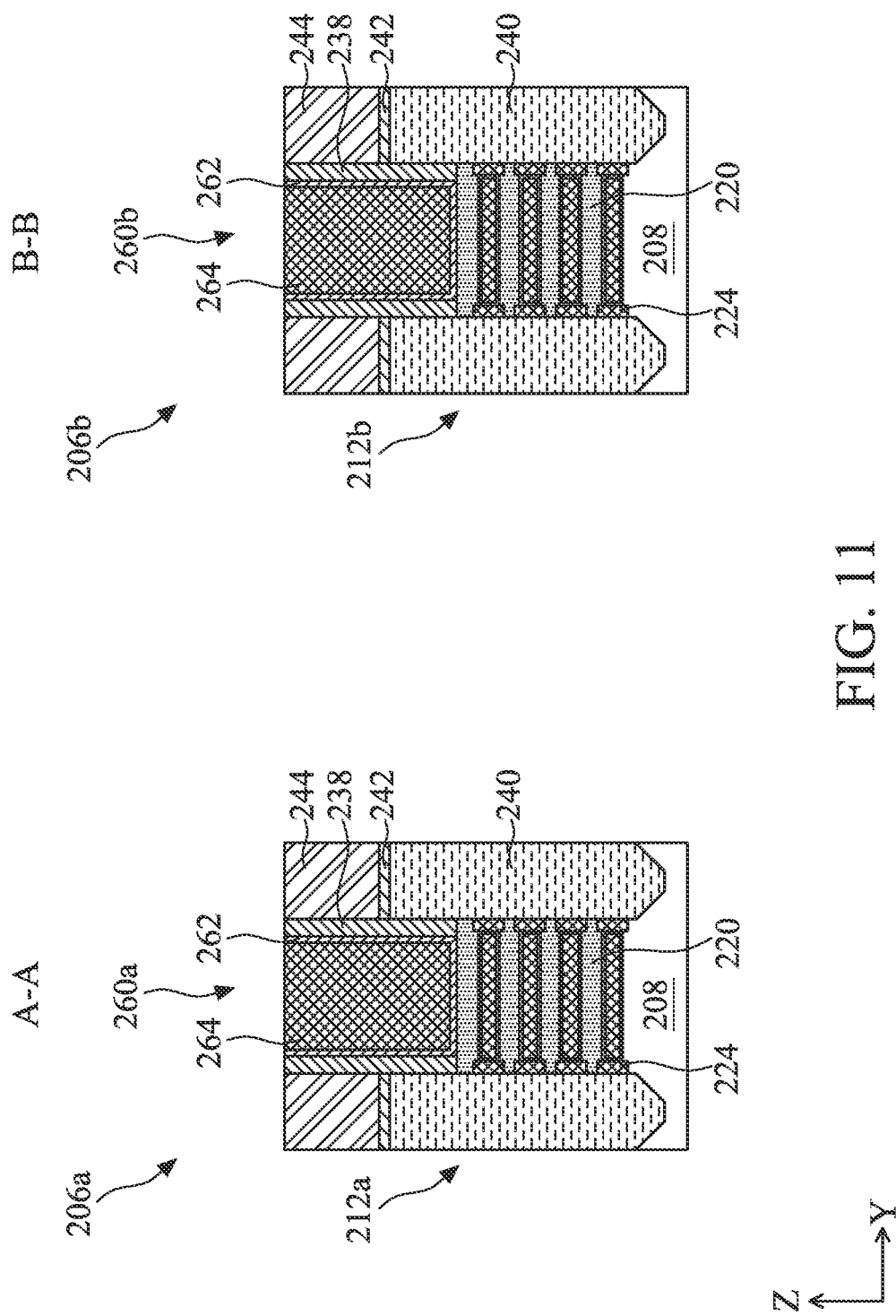

Referring to FIG. 10, the method 100 at operation 114 further removes the patterned mask (e.g., the hard mask 252) from the device 200 and optionally performs an anneal process to drive germanium contained in the semiconductor layers 258 into their corresponding semiconductor layers 220. The device 200 is exposed to a gas that contains nitrogen (N), phosphorus, or other suitable elements. To avoid oxidation of the semiconductor layers 252 (e.g., silicon germanium or germanium tin), in some embodiments, the gas contains no oxygen content. The conditions of the anneal process are adjusted to control the profile and characteristics of the resulting channel. In an example, the anneal process is performed at temperatures between about 700° C. to about 1200° C. The anneal process may be performed for a relatively long period such as 10 seconds to 100 seconds (called "soaking") or a relatively short period such as hundreds of milliseconds to a few seconds (e.g., 200 milliseconds to 2 seconds) (called "spiking").

The anneal process causes germanium atoms, and possibly silicon atoms or tin atoms, contained in the semiconductor layers 258 to diffuse or migrate into the corresponding semiconductor layers 220. On the other hand, silicon atoms contained in the semiconductor layers 220 may also diffuse or migrate into the corresponding semiconductor layers 258. As a result of the migration of atoms, the semiconductor layers 258 decrease in germanium content, and the semiconductor layers 220 increase in germanium content. In an embodiment, after the anneal process, each of the semiconductor layers 258 is $Si_{1-x}Ge_x$ or $Ge_xSn_{1-x}$ that includes more than 0% but equal to or less than about 70% ($0.1 < x \leq 0.7$) Ge in molar ratio. Such a range of Ge is a result of diluting the initial concentration of Ge in the semiconductor layer 258 (e.g. about 60% to about 80%, as described above) and effectively lowers threshold voltage in the channel region 230b. Each semiconductor layer 258 and its corresponding semiconductor layer 220 may effectively combine to form a new suspended nanostructure (still denoted by numeral 220 for simplicity), as the material compositions of the semiconductor layers 258 and 220 become the same or similar (e.g., when germanium gets uniformly distributed throughout the semiconductor layers 258 and 220).

Still referring to FIG. 10, since the suspended nanostructures 220 in the second device structure 206b are formed as a combination of two semiconductor layers, the suspended nanostructures 220 in the second device structure 206b may be thicker in Z direction (and wider in X direction) than the suspended nanostructures 220 in the first device structure 206a. The method 100 at operation 114 may optionally perform a trimming operation to reduce the thickness of the suspended nanostructures 220 in the second device structure 206b. The trimming operation uses any suitable etching process such as dry etching, wet etching, and/or RIE. In an embodiment, the suspended nanostructures 220 in the second device structure 206b are trimmed to have about the same dimensions (thickness and/or width) as the suspended nanostructures 220 in the first device structure 206a. In a particular example, the method 100 at operation 114 includes a cyclic process of repeating the steps of epitaxial growing germanium-containing semiconductor layer 258, annealing to drive in germanium atoms, and trimming suspended nanostructures, as a way to further increase germanium content to above 80% in the suspended nanostructures 220, such as approximately 95% or near 100%.

According to the above disclosed embodiments of operation 114, the driven-in germanium atoms get distributed in the suspended nanostructures 220 in various ways, which may be tailored by controlling the conditions of implant energy, implant species, implant dosage, anneal conditions, etc. As described above and shown in FIGS. 8 and 9, during the germanium implantation or germanium-containing semiconductor layers epitaxial growing, the middle sections of the suspended nanostructures 220 of the second device structure 206b are affected by the process. Thus, during the doping, germanium atoms may be driven mostly into the middle sections (and not the end sections) of corresponding suspended nanostructures 220. FIG. 10 also depicts an example concentration profile of germanium in a suspended nanostructure 220 along its lengthwise direction (Y-direction). As shown in FIG. 10, a concentration of germanium in the middle section of the suspended nanostructure 220 is higher than a concentration of the germanium in the two end sections. Any suitable methods of determining concentration may be used (e.g., by determining an average concentration or median concentration). In an embodiment, the concentration of the germanium in the middle section of each suspended nanostructure 220 is substantially uniform, while the concentration of the germanium in the end sections takes a gradient profile (e.g., gradually decreasing from the high concentration in the middle section until the concentration becomes zero). Note that, due to the spreading nature of germanium migration, the concentration of germanium may start to decrease at points C and C' shown in FIG. 10, which may be a few nanometers off from the interface between the middle section and an end section (i.e., a few nanometers off from a position flush with a sidewall of the gate spacers 238). In some embodiments (for example, when the anneal process has a short duration and/or low temperatures), germanium does not reach far enough under the gate spacers 238 to reach the source region and the drain region. Instead, the concentration of germanium drops to zero at the points D and D'. Thus, at least a portion of the two end sections—which is in direct contact with the gate spacers 238, the inner spacers 224, the source/drain features 240—is substantially devoid of germanium. In an embodiment, the entire end sections of the suspended nanostructure 220 are substantially devoid of germanium. Similarly, for a X-Z plane cross-sectional cut between points C and C', a concentration of germanium in a core portion of each suspended nanostructure 220 may be equal to or lower than a concentration of germanium in an edge (outer) portion of the suspended nanostructure 220. In one example, a uniform germanium concentration of about 34% to 38% is achieved in both the core portion and the edge portion of the suspended nanostructure 220. Yet in another example, a germanium concentration of about 45% to 50% is achieved in the edge portion of the suspended nanostructure 220, while the core portion of the suspended nanostructure 220 is substantially devoid of germanium atoms. Such a gradient profile may be caused by the relatively short duration of the anneal process (e.g., insufficient time for germanium to migrate all the way to the core). In some embodiments, the edge portion of the suspended nanostructure 220 includes a thin tin-containing outer layer as a remnant of the semiconductor layer 258 that contains $Ge_xSn_{1-x}$.

At operation 116, the method 100 (FIG. 1A) continues to form gate stacks 260a and 260b over the channel regions 230a and 230b of the first device structure 206a and the second device structure 206b, respectively. The gate stack 260a engages the n-type channel region 230a, thereby forming an n-type GAA transistor on the first device structure 206a. The gate stack 260b engages the p-type channel region 230b, thereby forming a p-type GAA transistor on the second device structure 206b. Referring to the example of FIG. 11, the gate stacks 230a and 230b fill the openings in the channel regions and wrap around each of the suspended nanostructures 220. The gate stacks 260a and 260b have similar structures but in some embodiments use different metals and/or different thicknesses of layers. In the present embodiment, the gate stacks 260a and 260b include a gate dielectric layer 262 which may include one or multiple layers of dielectric materials on interior surfaces of the opening and directly wrapping over each of the suspended nanostructures 220. The gate dielectric layer 262 includes a dielectric material such as silicon oxide or silicon oxynitride, and is formed by chemical oxidation, thermal oxidation, ALD, CVD, and/or other suitable methods. In some embodiments, the gate dielectric layer 262 also includes a high-k dielectric layer such as hafnium oxide, zirconium oxide, lanthanum oxide, titanium oxide, yttrium oxide, strontium titanate, other suitable metal-oxides, or combinations thereof; and is formed by ALD and/or other suitable methods. The gate stacks 260a and 260b further include a gate metal layer 264 which may include one or multiple metal work function layers over the gate dielectric layer 262, and a metal fill layer over the metal work function layers. In some embodiments, the metal work function layer is an n-type metal work function layer or a p-type metal work function layer. The n-type metal work function layer comprises a metal selected from, but not limited to, the group of titanium, aluminum, tantalum carbide, tantalum carbide nitride, tantalum silicon nitride, or combinations thereof. The p-type metal work function layer comprises a metal selected from, but not limited to, the group of titanium nitride, tantalum nitride, ruthenium, molybdenum, tungsten, platinum, or combinations thereof. In some embodiments, the p-type or n-type metal work function layer includes a plurality of layers deposited by CVD, PVD, and/or other suitable process. By doping channel layers of the p-type FETs with threshold modifying impurity, threshold voltages can be fine-tuned without a need of complicated metal work function scheme in p-type FETs. The metal fill layer includes aluminum, tungsten, cobalt, copper, and/or other suitable materials, and is formed by CVD, PVD, plating, and/or other suitable processes. In some embodiments, the gate stacks 260a and 260b wrap around the vertically-stacked horizontally-oriented channel semiconductor layers. Hence, the device 200 is a stacked horizontal gate-all-around (S-HGAA) device. In an embodiment, after the gate stacks are deposited, a CMP process is performed to planarize a top surface of the device 200.

In various embodiments, the method 100 may optionally skip trimming process in operation 114 without reducing thickness and/or width of the suspended nanostructures 220 in the p-type channels of the second device structure 206b. Accordingly, a cross-sectional area of the suspended nanostructures 220 in the p-type GAA transistor may be larger than that in the n-type GAA transistor. Since p-type channel relies on holes for conduction, which has slower mobility than electrons in n-type channel, a larger cross-sectional area in p-type channel helps increasing channel effective width and thus higher current and better transistor performance.

In the discussion above, the method 100 (FIG. 1A) at operation 114 may dope the threshold modifying impurity (e.g., germanium) globally to all the p-type regions in the device 200. Alternatively, the method 100 at operation 114 may dope the threshold modifying impurity to selective p-type regions to create threshold voltage differences among p-type FETs. The device 200 may have two or more regions of different threshold voltages, such as at least a standard threshold voltage (SVt) region and a low threshold voltage (LVt) region. In the example of FIG. 12, the first device structure 206a for forming an n-type FET and the second device structure 206b for forming a first p-type FET are in the SVt region. Also depicted in FIG. 12 is a third device structure 206c for forming a second p-type FET in the LVt region. Compared to transistors located in a SVt region, transistors located in a LVt region has a lower threshold voltage and operate faster. Therefore, the transistors in a LVt region may be suitable for high-speed applications. The method 100 (FIG. 1A) at operation 112 may accordingly form the hard mask 252 covering both the first device structure 206a and the second device structure 206b with an opening that exposes the third device structure 206c. Consequently, the doping process (e.g., germanium implantation, low-temperature plasma doping, or germanium-containing epitaxial layer growing and anneal driving) is limited to the channel region 230c of the third device structure 206c. As a result, threshold voltage of the first p-type FET formed on the second device structure 206b is not adjusted, while the second p-type FET formed on the third device structure 206c has a lower threshold voltage than the first p-type FET formed on the second device structure 206b.

Still referring to FIG. 12, in yet another embodiment, the method 100 (FIG. 1A) at operation 114 may include two impurity doping processes. The hard mask 252 may first cover the first device 206a with an opening that exposes the channel region 230b of the second device structure 206b and the channel region 230c of the third device structure 206c. The method 100 at operation 114 performs a first impurity doping process that dopes a portion of the total dosage into both the channel regions 230b and 230c. Subsequently, a new hard mask is formed to cover the first device 206a and the second device 206b with an opening that exposes the third device structure 206c. The method 100 at operation 114 then performs a second impurity doping process that dopes the rest of the total dosage into the channel region 230c. For example, if a total dosage to be delivered is $2 \times 10^{15}/cm^2$, the first impurity doping process may be used to deliver a germanium dosage of $1 \times 10^{15}/cm^2$ to all the p-type FET regions globally on the device 200, and the second impurity doping process may be used to deliver a germanium dosage of $1 \times 10^{15}/cm^2$ to only LVt regions. In this manner, all the p-type FETs formed will have a reduced threshold voltage, while the p-type FETs in LVt regions have a lower Vt due to the higher received dosage.

Figure 1B:
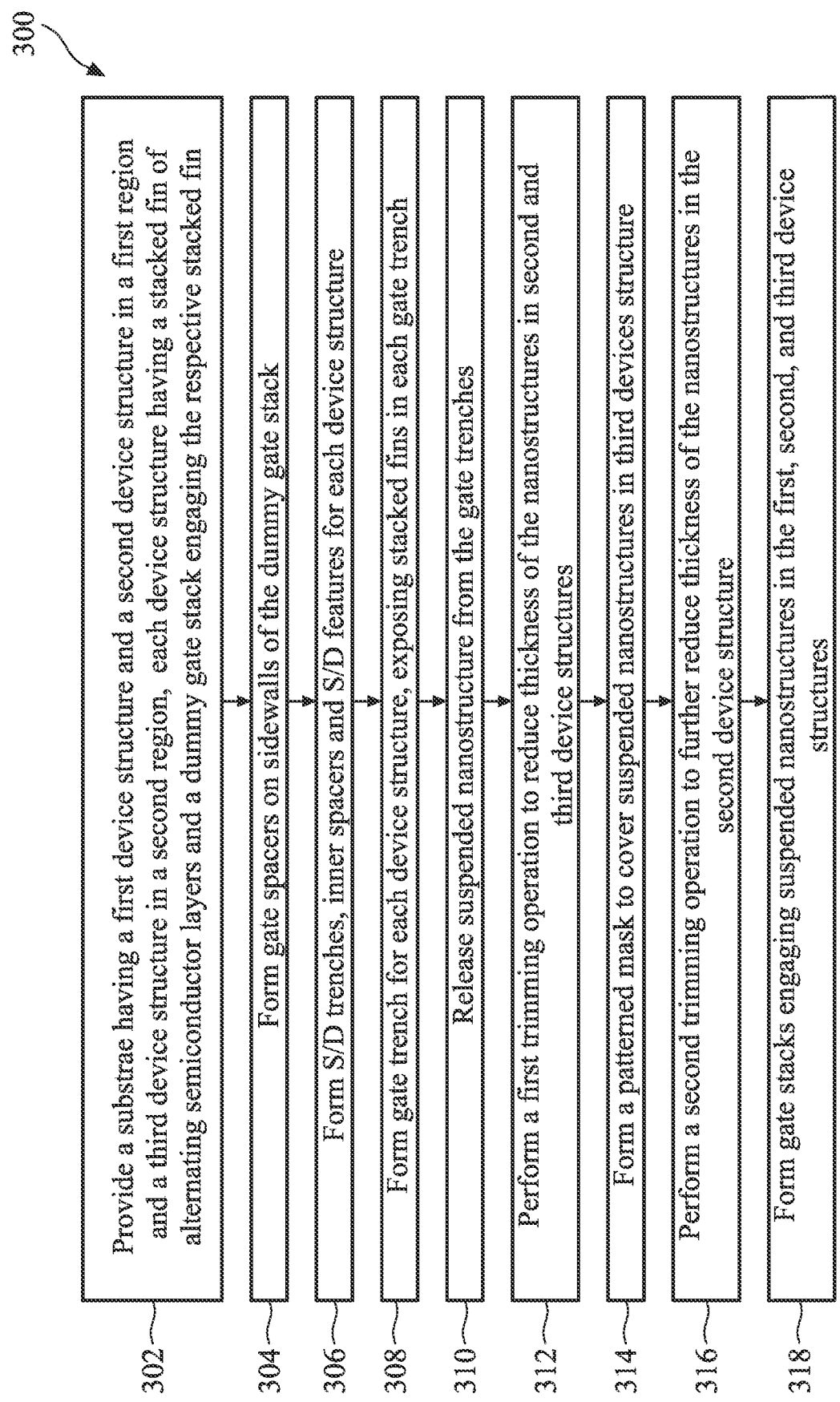
Figure 13:
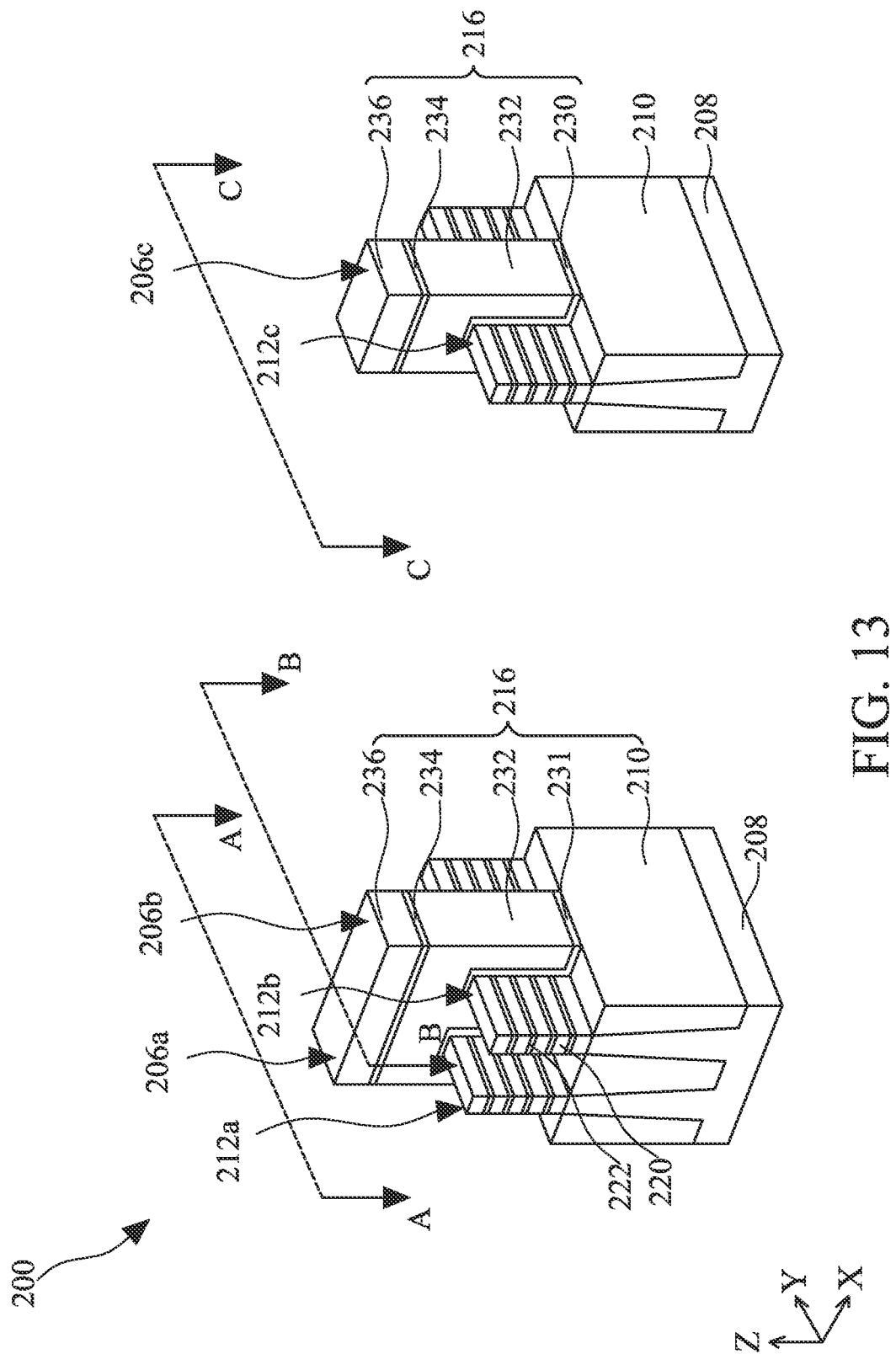

Attention is now turned to method 300. FIG. 1B illustrates a flow chart of method 300, according to various aspects of the present disclosure. Throughout the present disclosure, similar reference numerals denote similar features in terms composition and formation. Some details of operations in method 300 may be simplified or omitted if similar details have been described in conjunction with method 100. The method 300 is merely an example and is not intended to limit the present disclosure beyond what is explicitly recited in the claims. Additional operations can be provided before, during, and after the method 300, and some operations described can be replaced, eliminated, or moved around for additional embodiments of the method. Some embodiments of method 300 are described below in conjunction with FIGS. 13-22. FIG. 13 is a perspective view of the device 200. FIGS. 14-22 are cross-sectional views (listed side-by-side) of the device 200 along the B-B cut and C-C cut as shown in FIG. 13, which pass the respective channel region along the lengthwise direction of the p-type transistors (in Y-Z plane). A cross-sectional view passing a channel region along the lengthwise direction of an additional p-type transistor of the device 200 is also depicted in FIG. 22.

At operation 302, the method 300 (FIG. 1B) provides the device 200 that includes two or more regions of different threshold voltages, such as at least a standard threshold voltage (SVt) region and a low threshold voltage (LVt) region. In the example of FIG. 13, the first device structure 206a for forming an n-type FET and the second device structure 206b for forming a first p-type FET are in the SVt region. Also depicted in FIG. 13 is a third device structure 206c for forming a second p-type FET in the LVt region. As shown in FIG. 13, each of the device structures 206a-c includes the substrate 208, the isolation structure 210, the fins 212a-c that each comprises alternating semiconductor layers 220 and 222 vertically stacked (also refer to as stacked fins 212a-c), and dummy gate structures 216 engaging the stacked fins 212a-c. Because the substrate 208, the isolation structure 210, the semiconductor layers 220 and 222, and the dummy gate structure 216 have been described above, detailed descriptions thereof are omitted here.

Figure 14:
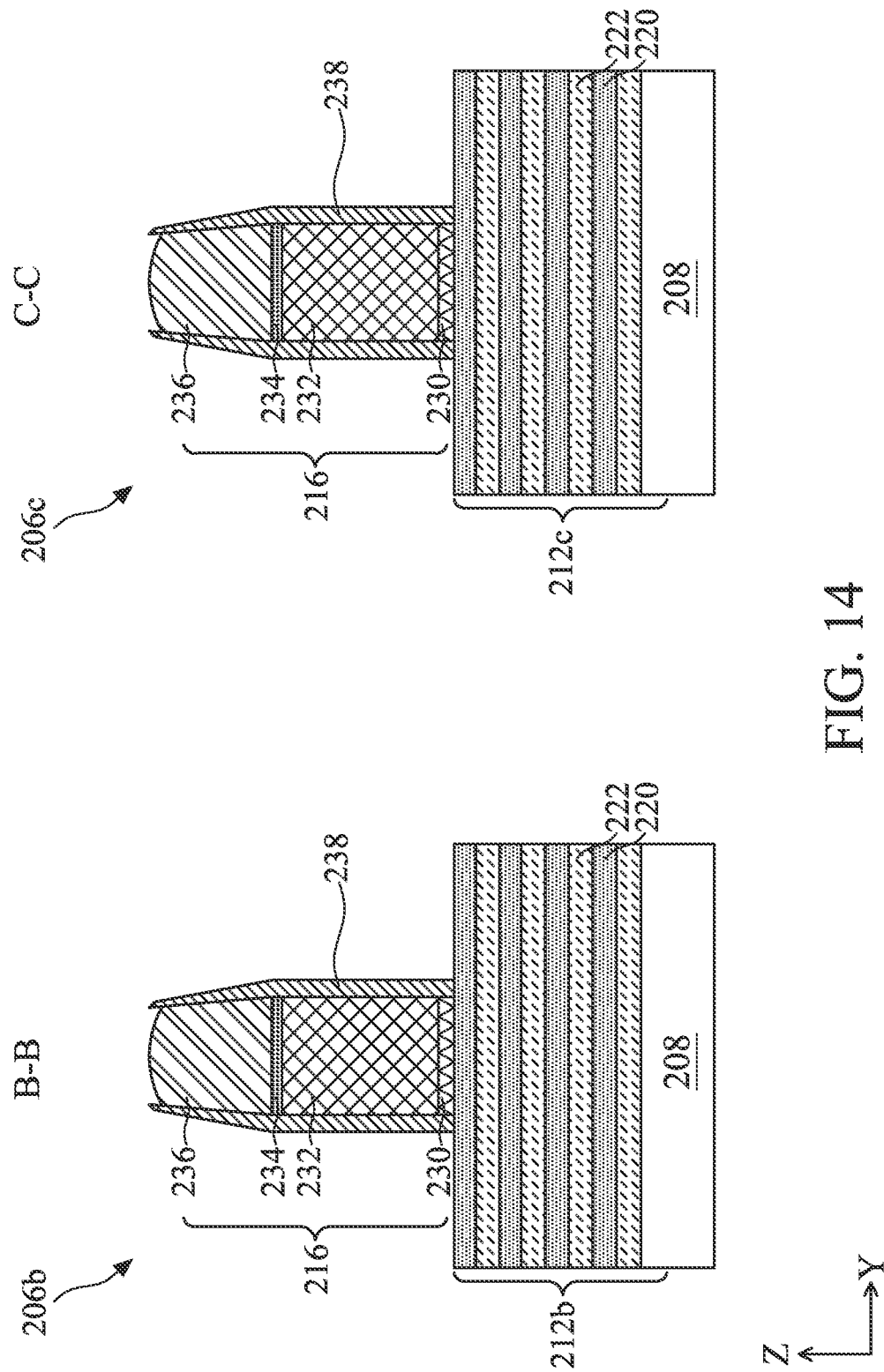

At operation 304, the method 300 (FIG. 1B) forms the gate spacers 238 over the sidewalls of the dummy gate structures 216, as shown in FIG. 14 (the A-A cut of the first device structure 206a for forming an n-type FET is omitted herein for the sake of simplicity). Because operation 304 is similar to operation 104 described above, detailed descriptions thereof are omitted for brevity.

Figure 15:
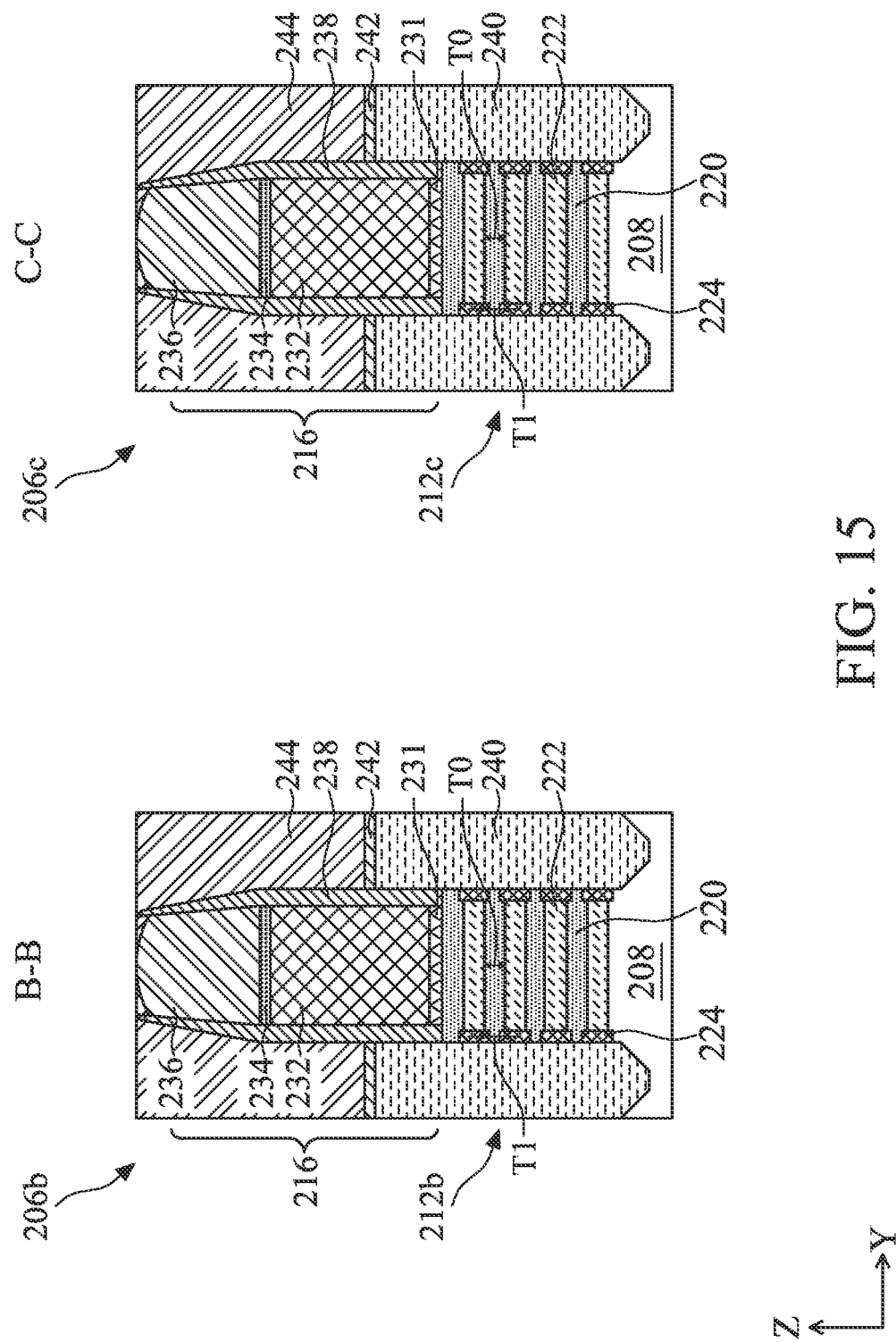

At operation 306, the method 300 (FIG. 1B) forms the inner spacers 224 and the S/D features 240, as shown in FIG. 15. Due to a lateral etching process in forming cavities to deposit the inner spacers 224 therein, the lateral etching may also remove a small portion of the semiconductor layers 220. As a result, a thickness T1 of the end sections of the semiconductor layers 220 is smaller than a thickness T0 of other portions of the semiconductor layers 220 that are under the sacrificial gate structure. Because operation 306 is similar to operation 106 described above, detailed descriptions thereof are omitted for brevity.

Figure 16:
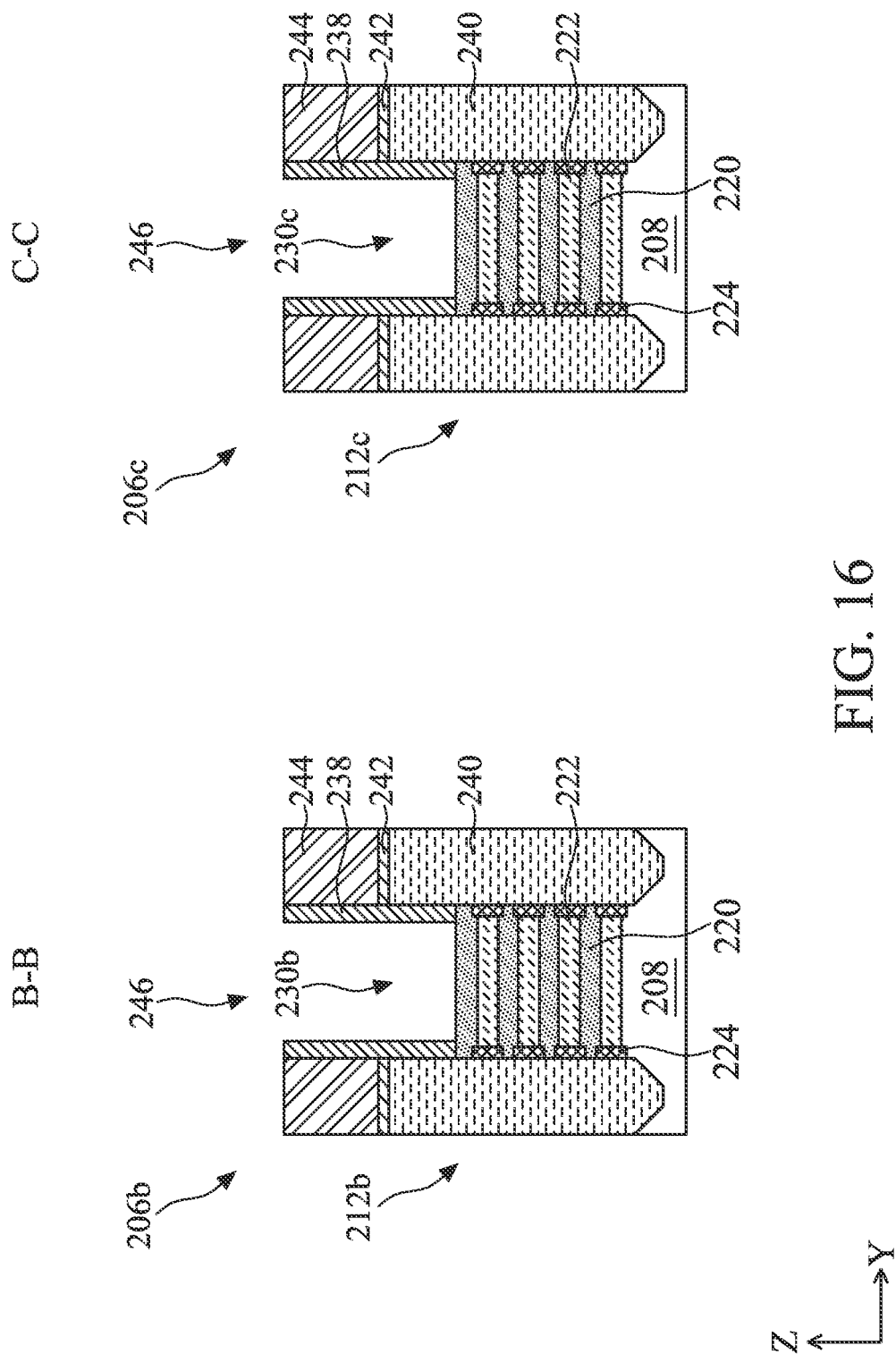

At operation 308, the method 300 (FIG. 1B) removes the dummy gate stacks 216 to form gate trenches 246, as shown in FIG. 16. Because operation 308 is similar to operation 108 described above, detailed descriptions thereof are omitted for brevity.

Figure 17:
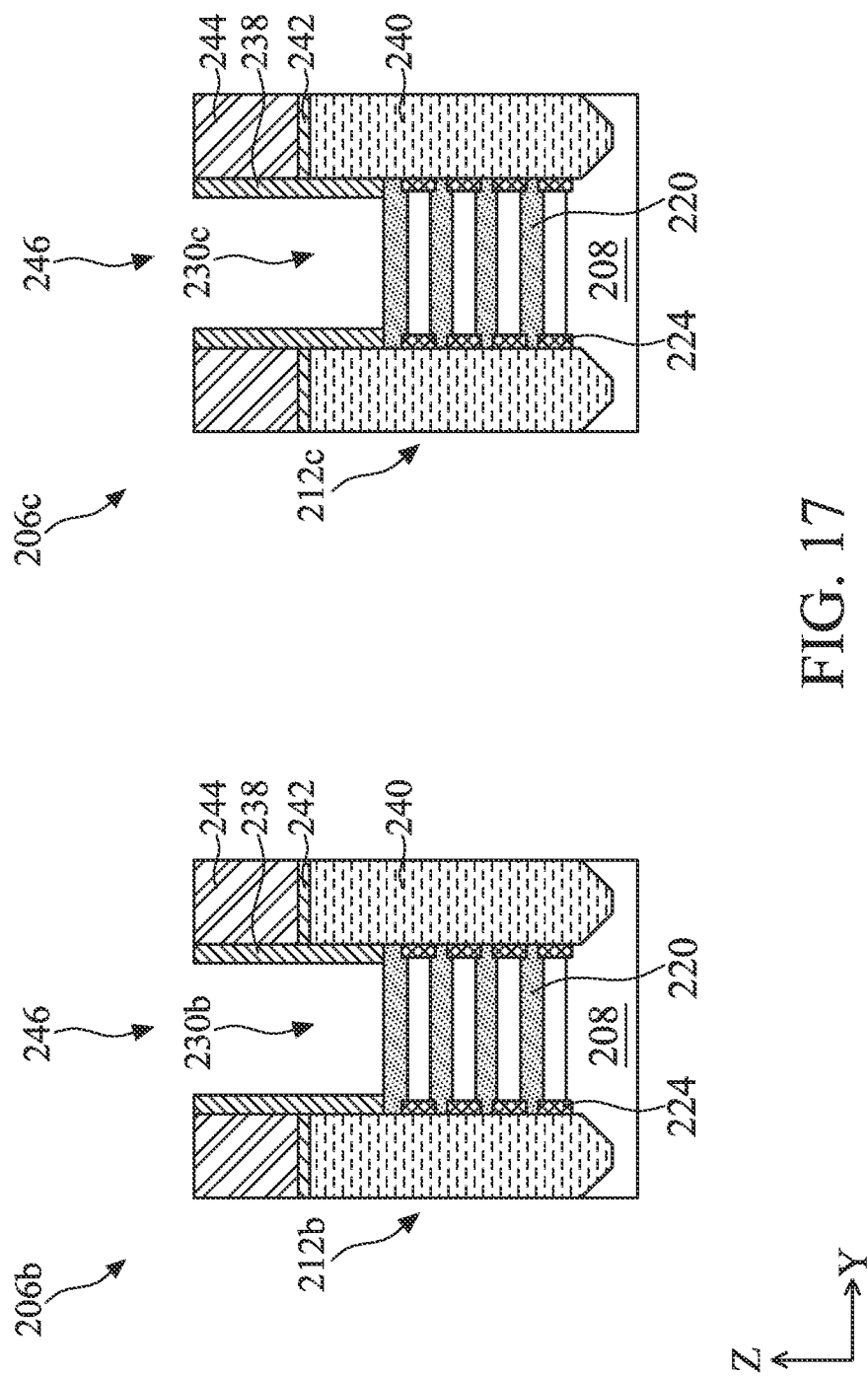

At operation 310, the method 300 (FIG. 1B) releases suspended nanostructures 220 in the exposed channel regions, as shown in FIG. 17. Because operation 310 is similar to operation 110 described above, detailed descriptions thereof are omitted for brevity.

Figure 18:
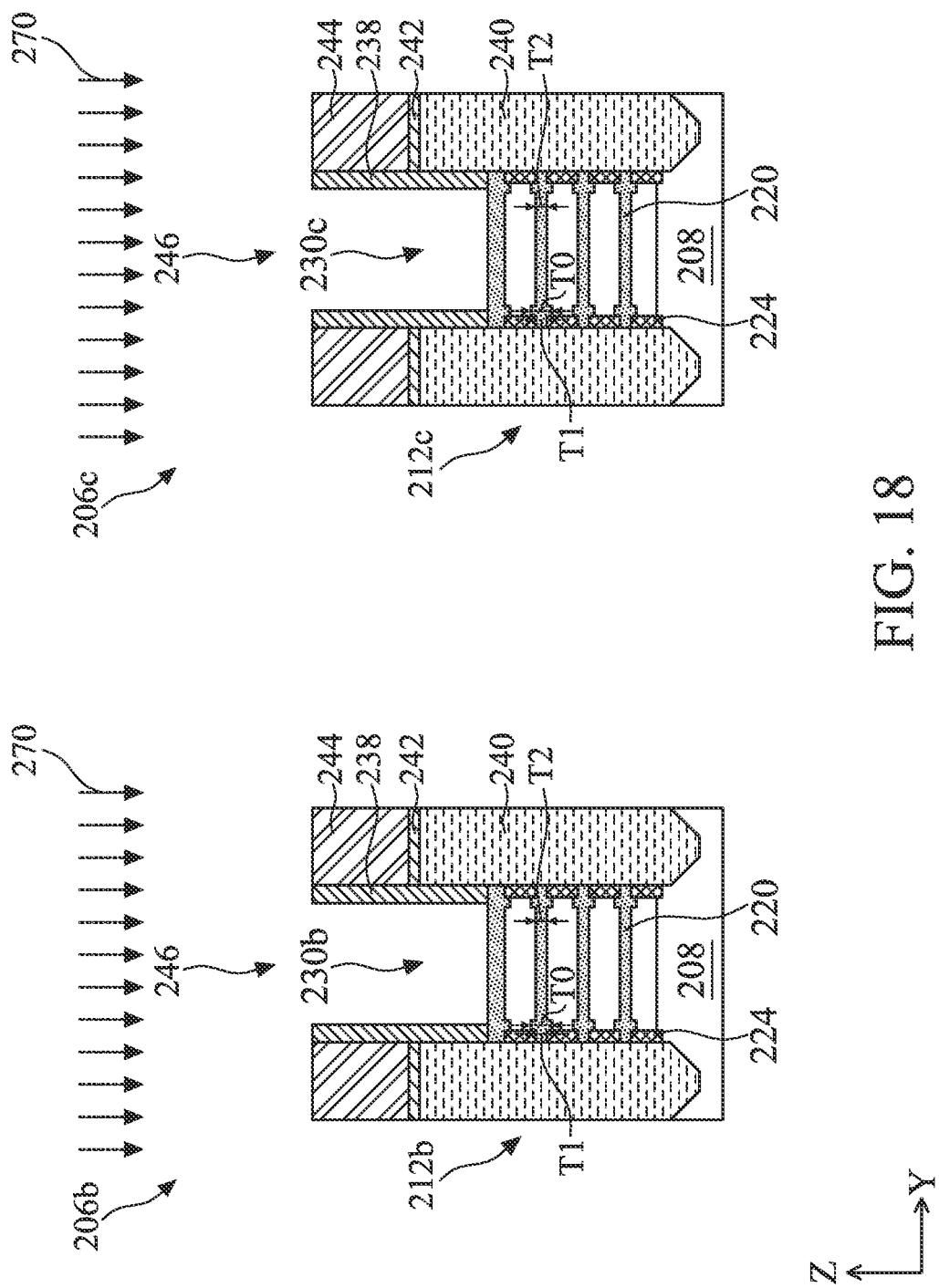

At operation 312, the method 300 (FIG. 1B) performs a trimming process 270 to reduce the thicknesses of the suspended nanostructures 220 in both the channel regions 230b and 230c (but not in the channel region 230a for the n-type FETs), as shown in FIG. 18. After the trimming process 270, the suspended nanostructures 220 in the both the channel regions 212b and 212c have substantially the same dimensions (thickness and/or width). The trimming operation uses any suitable etching process such as dry etching, wet etching, and/or RIE. During the trimming process 270, the gate spacers 238 protect the suspended nanostructures 220 therebelow from being etched. The trimming process 270 selectively removes portions of the suspended nanostructures 220 that are vertically aligned with the gate trenches 246, while leaving the two end sections of the suspended nanostructure 202 substantially unetched. The trimmed thickness of the middle section of the suspended nanostructure 220 is denoted as T2. In the illustrated embodiment, a small portion of the suspended nanostructure 220 directly under the gate spacer 238 but not sandwiched by the inner spacers 224 may still remain the original thickness T0, which is larger than both the thickness T1 of the two end sections and the trimmed thickness T2 of the middle section, such as about 1 nm to about 3 nm larger. The trimmed thickness T2 may be smaller or larger than the thickness T1 of the two end sections, in various embodiments. In one embodiment, the trimmed thickness T2 substantially equals thickness T1. A reduced thickness of the suspended nanostructures 220 increases the threshold voltage in the respective channel regions, such that smaller trimmed thickness T2 of the suspended nanostructures causes a greater increase in the threshold voltage. In some embodiments, an increase in a range from about 20 mv to about 100 mv can be achieved by trimming middle sections of the suspended nanostructures by about 1 nm to about 3 nm (T0-T2) proportionally.

Figure 19:
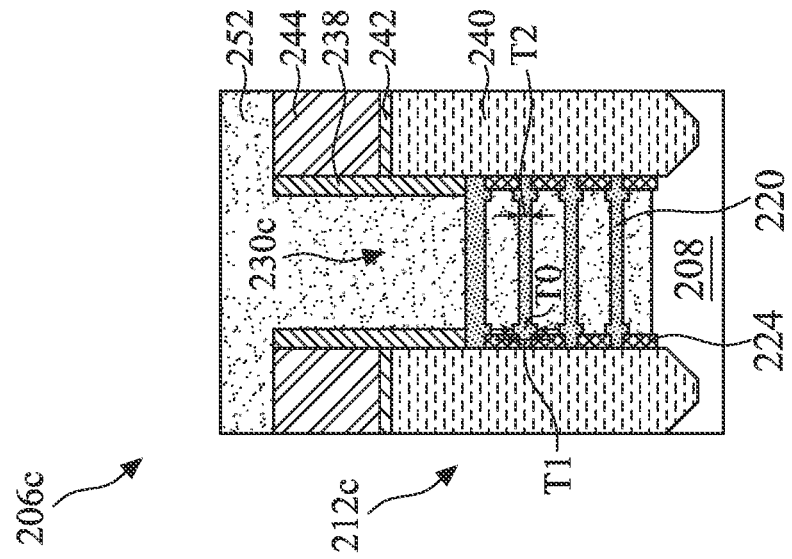
Figure 19:
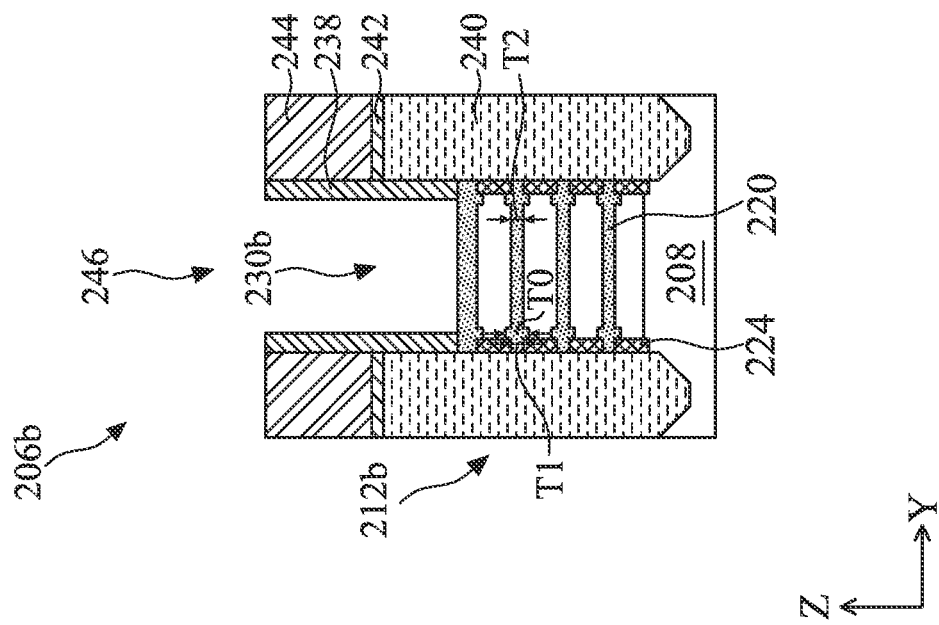

At operation 314, the method 300 (FIG. 1B) forms a patterned mask, such as a hard mask 252 describe above, on the top surface of the device 200, as shown in FIG. 19. The patterned mask covers the third device structure 206c and has an opening exposing the second device structure 206b. Because operation 314 is similar to operation 112 described above, detailed descriptions thereof are omitted for brevity.

Figure 20:
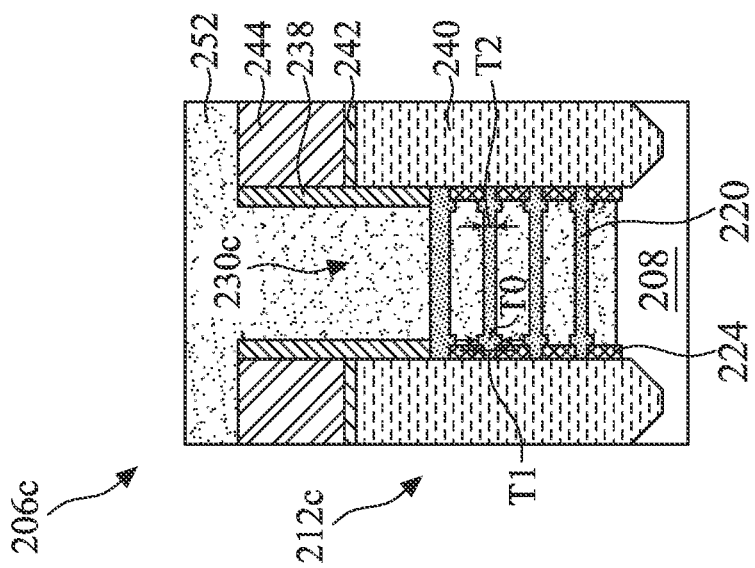
Figure 20:
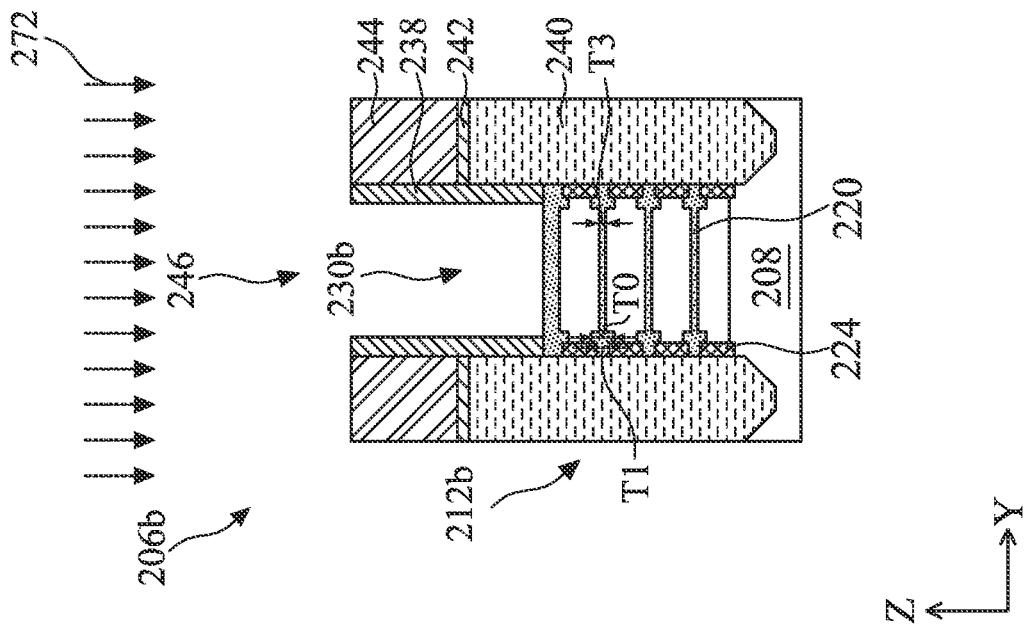

At operation 316, the method 300 (FIG. 1B) performs a second trimming process 272 to further reduce the thickness of the suspended nanostructures 220 in the channel regions 230b of the second device structure 206b, as shown in FIG. 20. The trimming operation uses any suitable etching process such as dry etching, wet etching, and/or RIE. During the trimming process 272, the hard mask 252 protects the suspended nanostructures 220 in the third device structure 206c from being etched. The trimming process 272 selectively removes extra portions of the suspended nanostructures 220 in the second device structure 206b that are vertically aligned with the gate trenches 246, while leaving the two end sections of the suspended nanostructure 220 substantially unetched. As a result of the trimming process 272, the trimmed thickness of the middle section of the suspended nanostructure 220 in the channel region 230b is further reduced, denoted as T3. In the illustrated embodiment, a small portion of the suspended nanostructure 220 directly under the gate spacer 238 but not sandwiched by the inner spacers 224 may still remain the original thickness T0, which is larger than both the thickness T1 of the two end sections and the trimmed thickness T3 of the middle section, such as about 1 nm to about 4 nm larger. The trimmed thickness T3 in the channel region 230b is smaller than the trimmed thickness T2 in the channel region 230c for about 1 nm to about 3 nm. The trimmed thickness T3 may be smaller or larger than the thickness T1 of the two end sections, in various embodiments. In one embodiment, the trimmed thickness T3 substantially equals thickness T1. In a particular example, the trimmed thickness T3 of the middle section in the channel region 230b is smaller than the thickness T1 of the end sections, while the trimmed thickness T2 of the middle section in the channel region 230c is larger than the thickness T1 of the end sections. Since a reduced thickness of the suspended nanostructures further increases the threshold voltage in the respective channel region, the p-type FET in the SVt region formed on the second device structure 230b has a threshold voltage larger than the p-type FET in the LVt region formed on the third device structure 230c. After operation 316, the hard mask 252 is removed in a suitable etching process.

Figure 21:
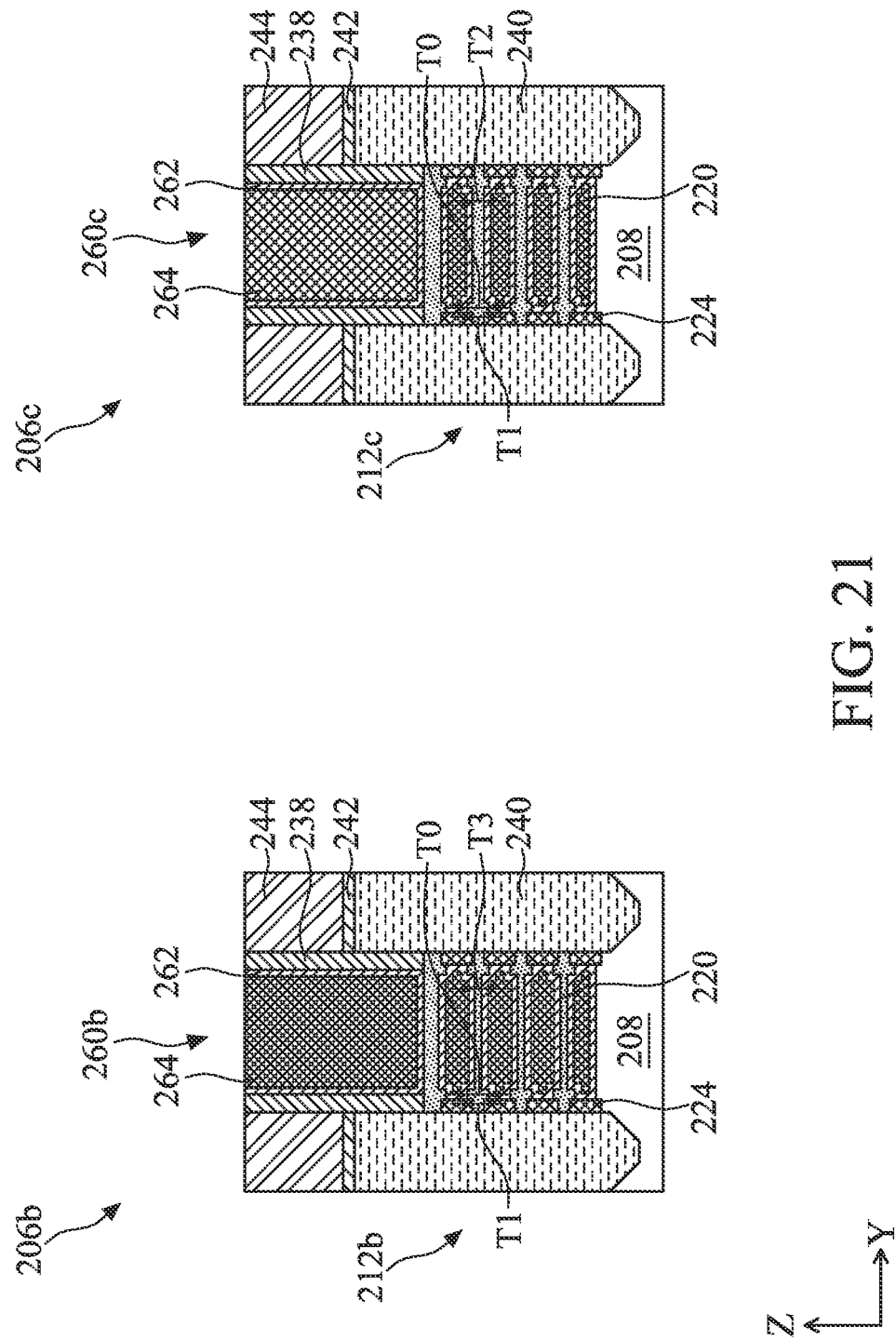
Figure 22:
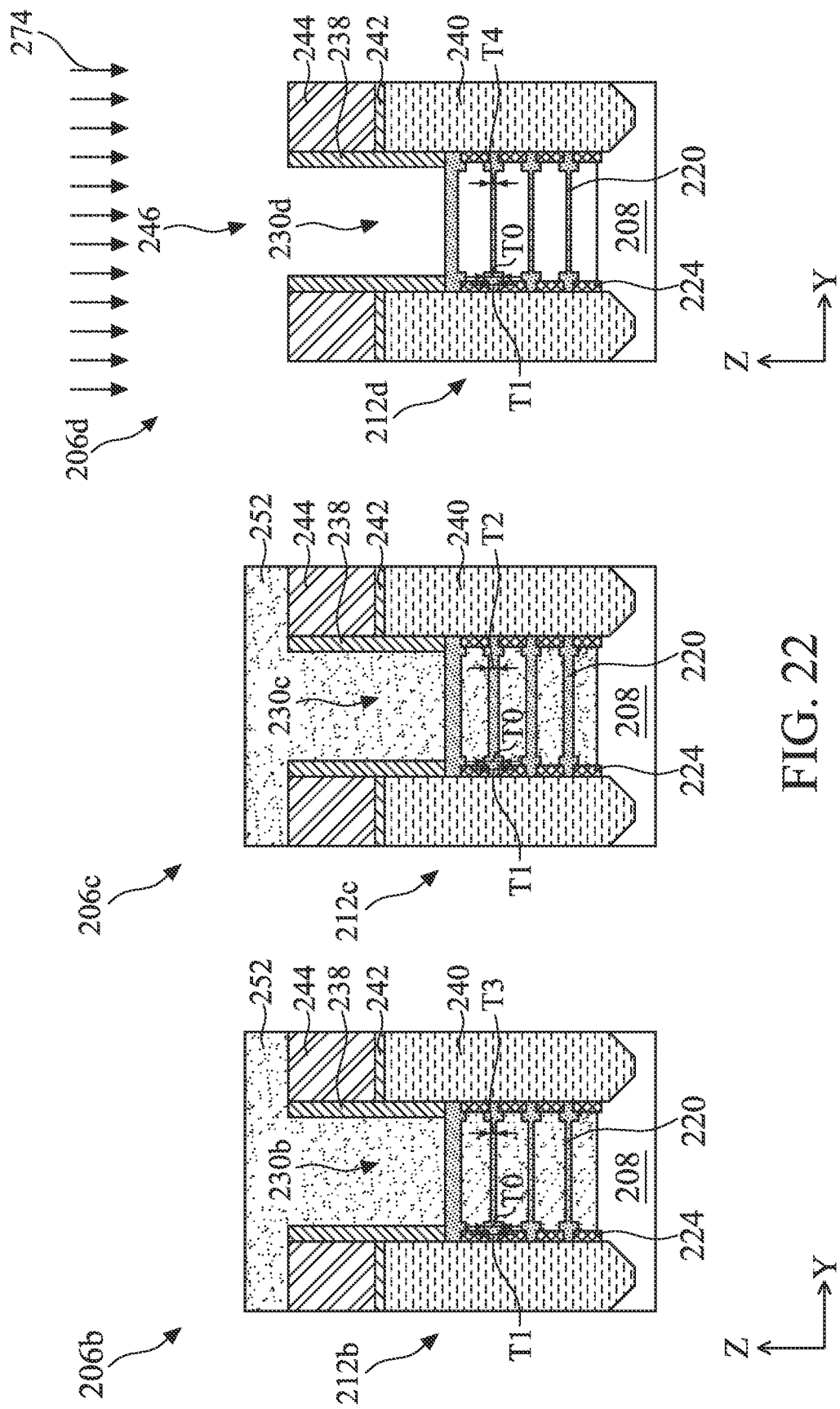

At operation 318, the method 300 (FIG. 1B) continues to form gate stacks over respective channel regions, as shown in FIG. 21. Because operation 318 is similar to operation 116 described above, detailed descriptions thereof are omitted for brevity. Note that, due to the removal of extra portions of the suspended nanostructure 220 of the second device structure 206b, the gate metal layer 264 in the gate stack 260b has a larger volume than the gate metal layer 264 in the gate stack 260c. By trimming channel layers of the p-type FETs, threshold voltages can be fine-tuned without a need of complicated metal work function scheme in the gate stacks of the p-type FETs.

Referring to FIG. 22, alternatively, the device 200 may further includes high threshold voltage (HVt) region besides the SVt region and LVt region and a fourth device structure 206d for forming a third p-type FET in the HVt region. Since a reduced thickness of the suspended nanostructures further increases the threshold voltage of the corresponding field effect transistor, the method 300 may perform the first trimming process 270 to all three device structures 206b-206d, then perform the second trimming process 272 to the device structures 206b and 206d (by covering the device structure 206c with a patterned mask), and subsequently perform a third trimming process 274 to the fourth device structure 206d in the HVt region only (by forming another patterned mask to cover the device structures 206b-c). Accordingly, the fourth device structure 206d receives three trimming processes and has the smallest thickness, denoted as T4. The thicknesses T0, T2, T3, and T4 have the relationship T0>T2>T3>T4. In this manner, all the p-type FETs in three regions will have an increased Vt due to receiving at least one trimming process, while the p-type FETS in SVt regions have a higher threshold voltage than the p-type FETs in LVt regions due to receiving an extra trimming process and accordingly smaller channel layer thickness, and the p-type FETs in HVt regions have the highest threshold voltage due to receiving two extra trimming processes and accordingly the smallest channel layer thickness. In one embodiment, T1 is larger than T3 and T4 but smaller than T2.

Figure 1C:
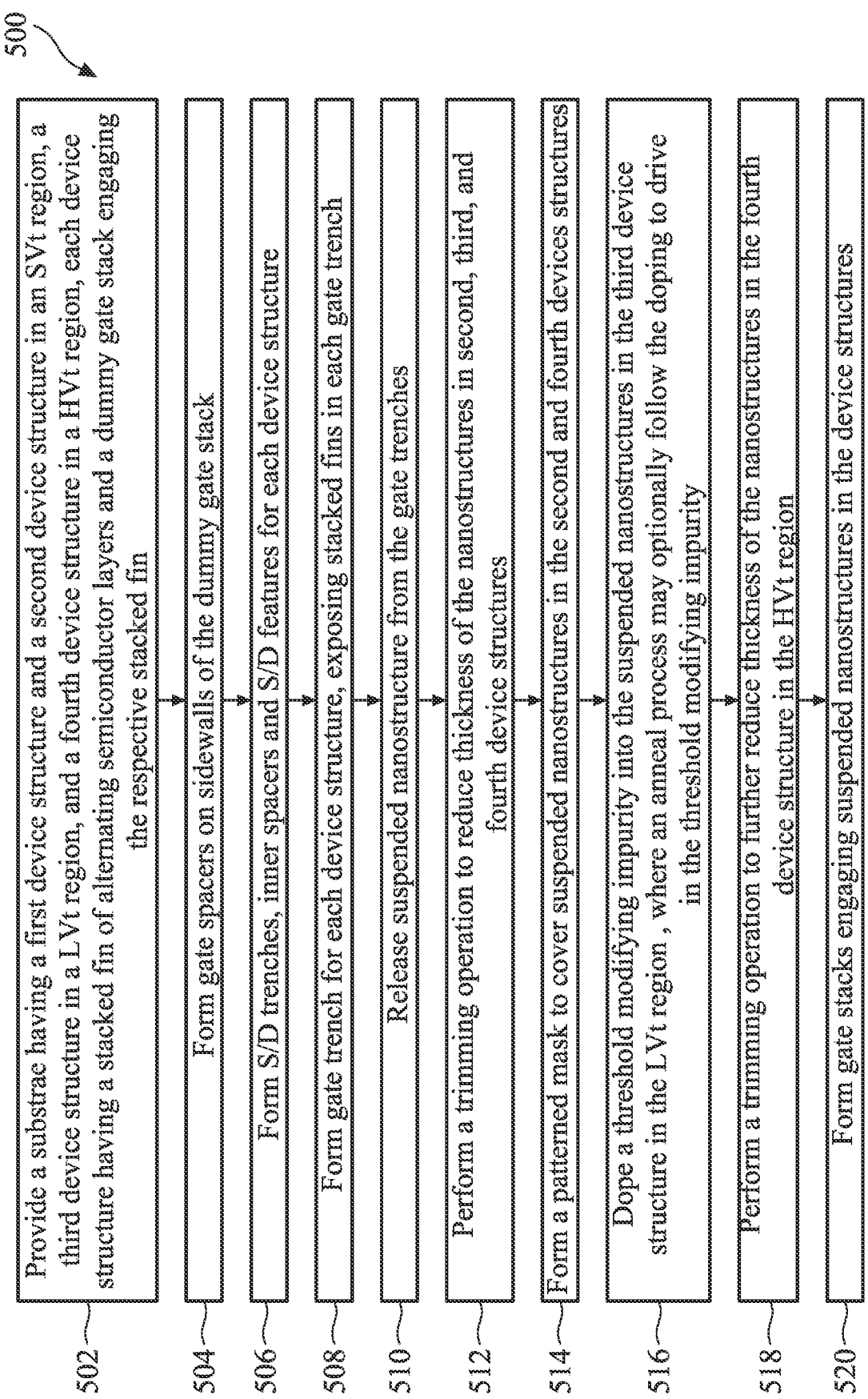
Figure 23:
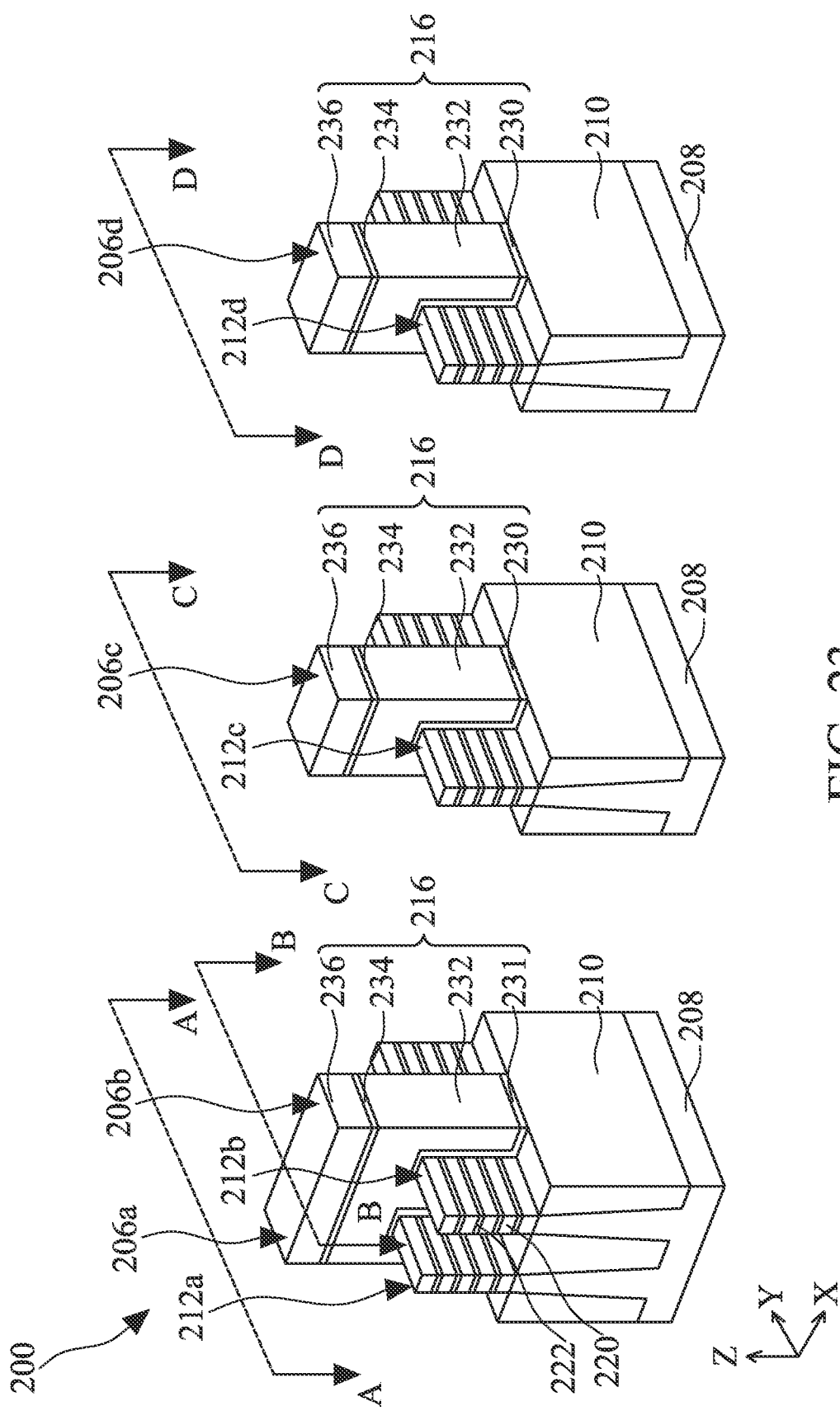

Attention is now turned to method 500. FIG. 1C illustrates a flow chart of method 500, according to various aspects of the present disclosure. Throughout the present disclosure, similar reference numerals denote similar features in terms composition and formation. Some details of operations in method 500 may be simplified or omitted if similar details have been described in conjunction with methods 100 and 300. The method 500 is merely an example and is not intended to limit the present disclosure beyond what is explicitly recited in the claims. Additional operations can be provided before, during, and after the method 500, and some operations described can be replaced, eliminated, or moved around for additional embodiments of the method. Some embodiments of method 500 are described below in conjunction with FIGS. 23-32. FIG. 23 is a perspective view of the device 200. FIGS. 24-32 are cross-sectional views (listed side-by-side) of the device 200 along the B-B cut, C-C cut, and D-D cut as shown in FIG. 23, which pass the respective channel region along the lengthwise direction of the p-type transistors (in Y-Z plane).

At operation 502, the method 500 (FIG. 1C) provides the device 200 that includes three different threshold voltage regions, namely, a standard threshold voltage (SVt) region, a low threshold voltage (LVt) region, and a high threshold voltage (HVt) region. In the example of FIG. 23, the first device structure 206a for forming an n-type FET and the second device structure 206b for forming a first p-type FET are in the SVt region. The third device structure 206c for forming a second p-type FET is in the LVt region. The fourth device structure 206d for forming a third p-type FET is in the HVt region. As shown in FIG. 23, each of the device structures 206a-d includes the substrate 208, the isolation structure 210, the fins 212a-d that each comprises alternating semiconductor layers 220 and 222 vertically stacked (also refer to as stacked fins 212a-d), and dummy gate structures 216 engaging the stacked fins 212a-d. Because the substrate 208, the isolation structure 210, the semiconductor layers 220 and 222, and the dummy gate structure 216 have been described above, detailed descriptions thereof are omitted here.

Figure 24:
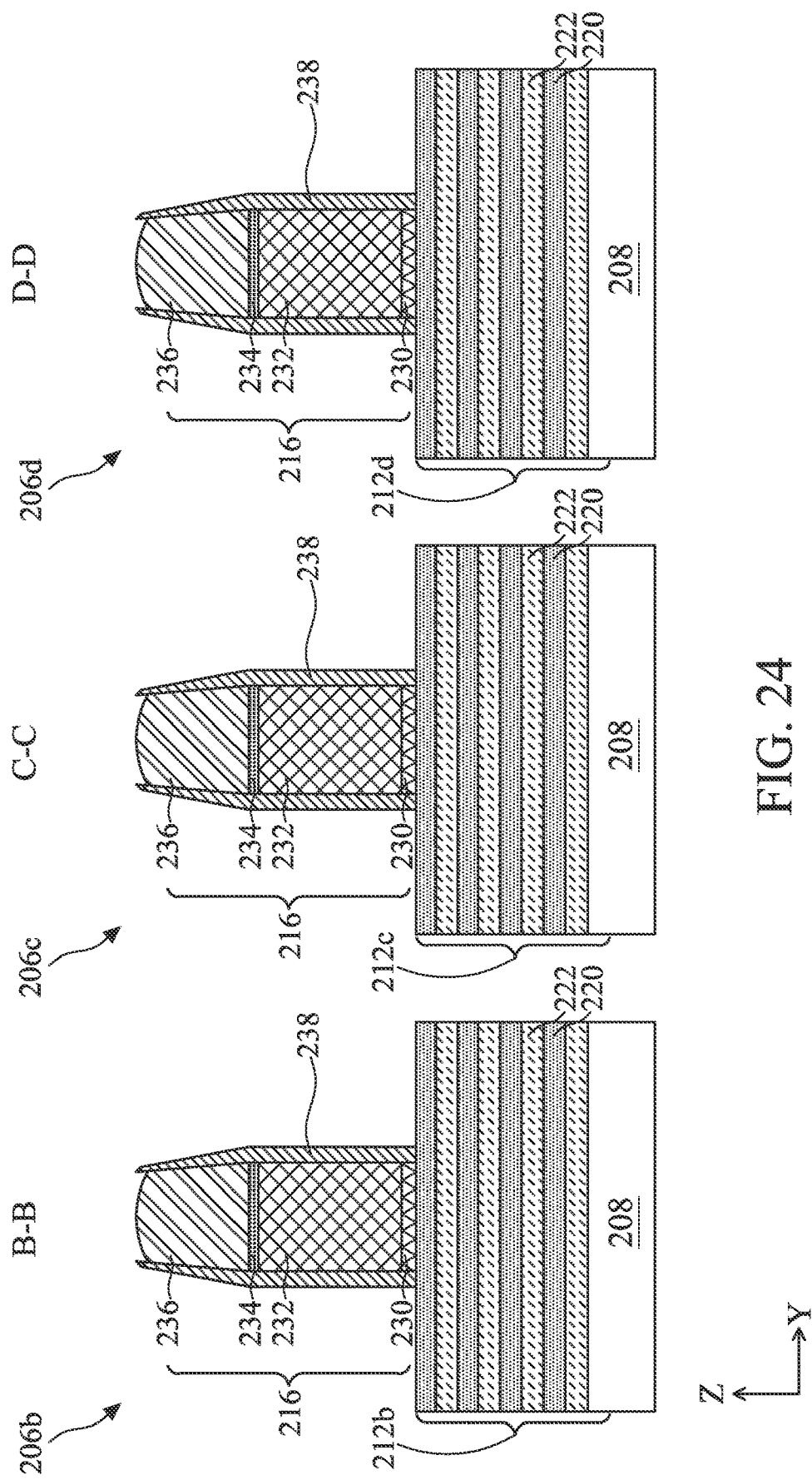

At operation 504, the method 500 (FIG. 1C) forms the gate spacers 238 over the sidewalls of the dummy gate structures 216, as shown in FIG. 24 (the A-A cut of the first device structure 206a for forming an n-type FET is omitted herein for the sake of simplicity). Because operation 504 is similar to operation 104 described above, detailed descriptions thereof are omitted for brevity.

Figure 25:
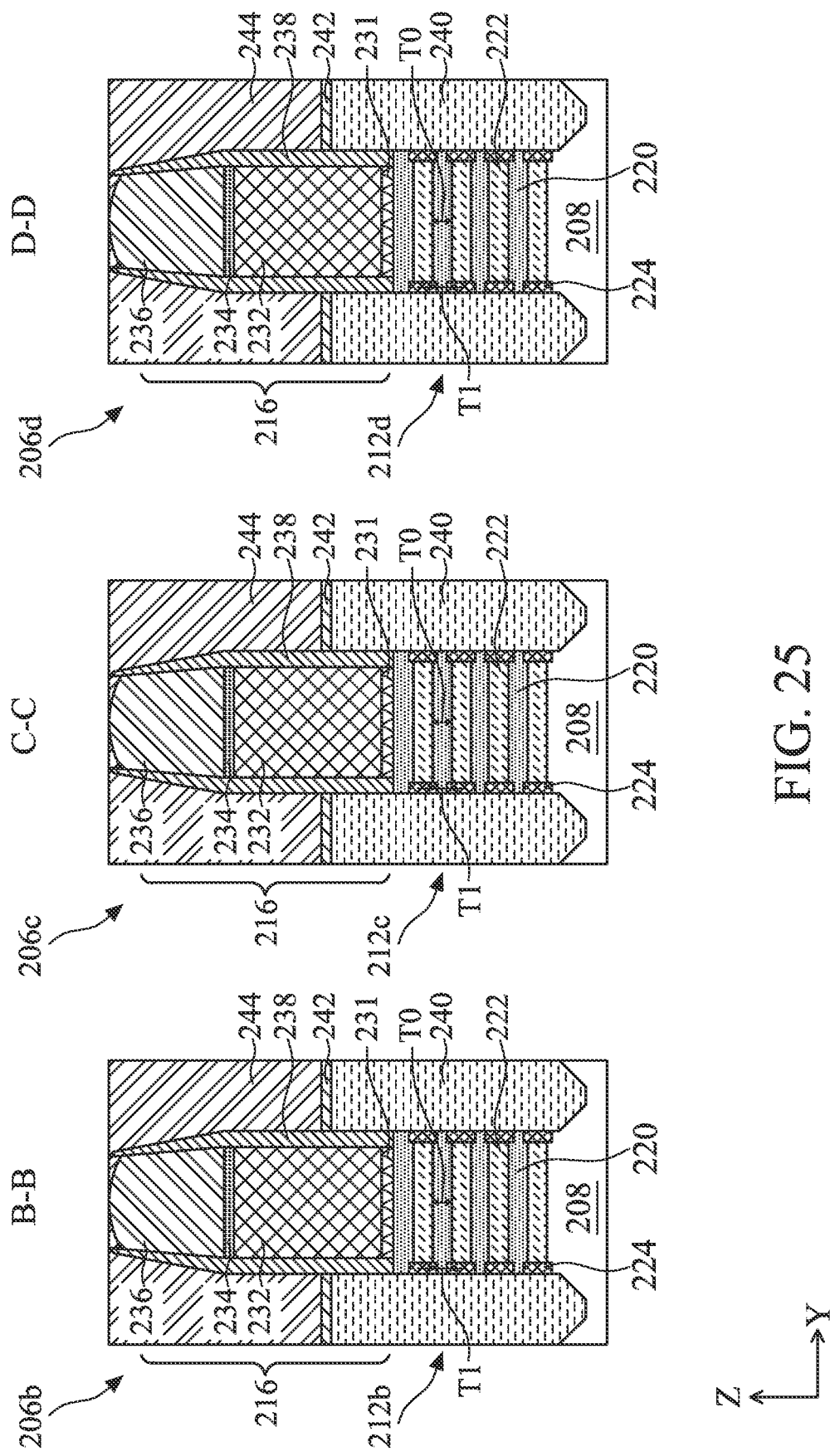

At operation 506, the method 500 (FIG. 1C) forms the inner spacers 224 and the S/D features 240, as shown in FIG. 25. Due to a lateral etching process in forming recesses to deposit the inner spacers 224 therein, the lateral etching may also remove a small portion of the semiconductor layers 220. As a result, a thickness T1 of the lateral ends of the semiconductor layers 220 is smaller than thickness T0 of other portions of the semiconductor layers 220 that are under the sacrificial gate structure. Because operation 506 is similar to operation 106 described above, detailed descriptions thereof are omitted for brevity.

Figure 26:
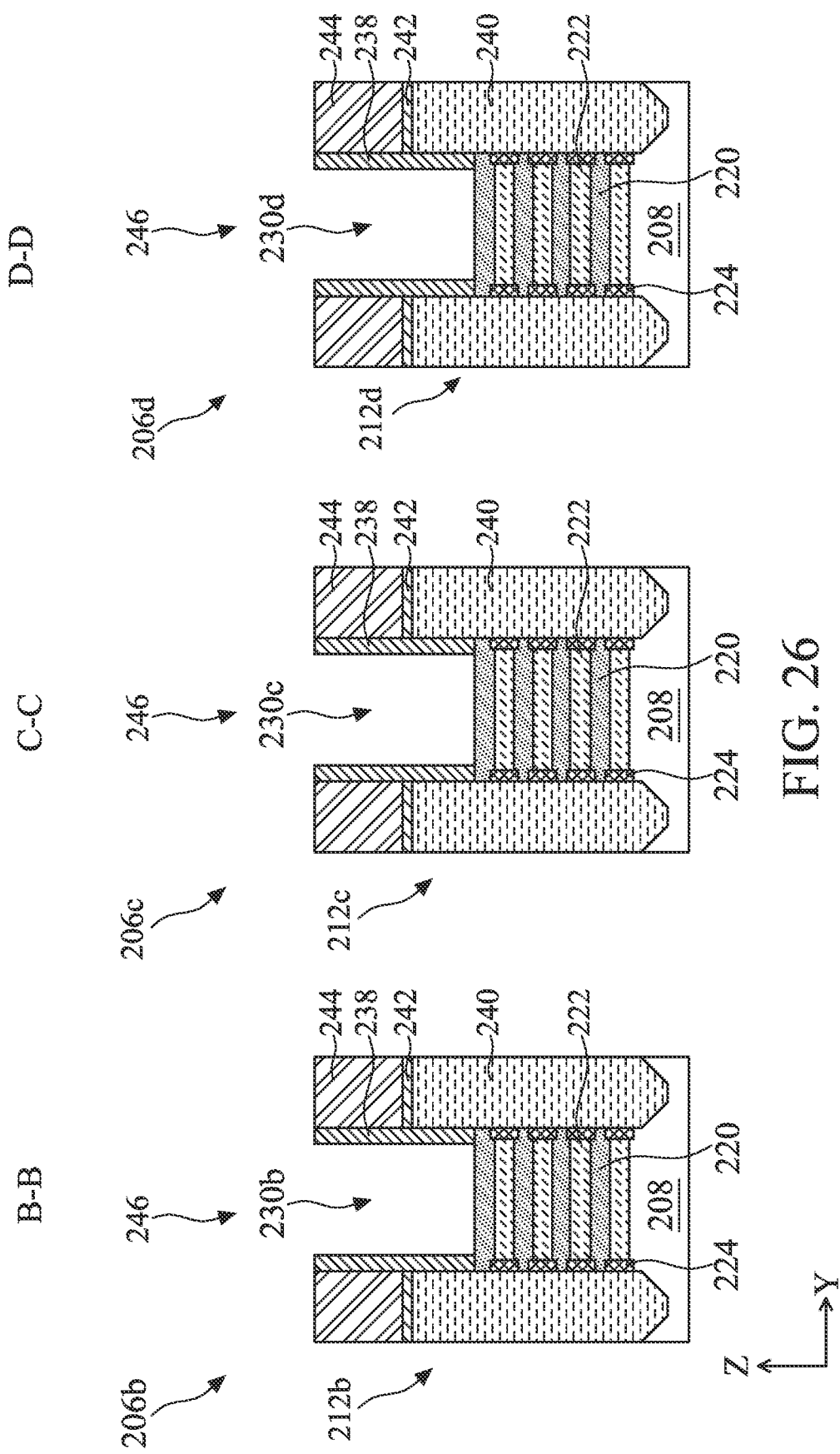

At operation 508, the method 500 (FIG. 1C) removes the dummy gate stacks 216 to form gate trenches 246, as shown in FIG. 26. Because operation 508 is similar to operation 108 described above, detailed descriptions thereof are omitted for brevity.

Figure 27:
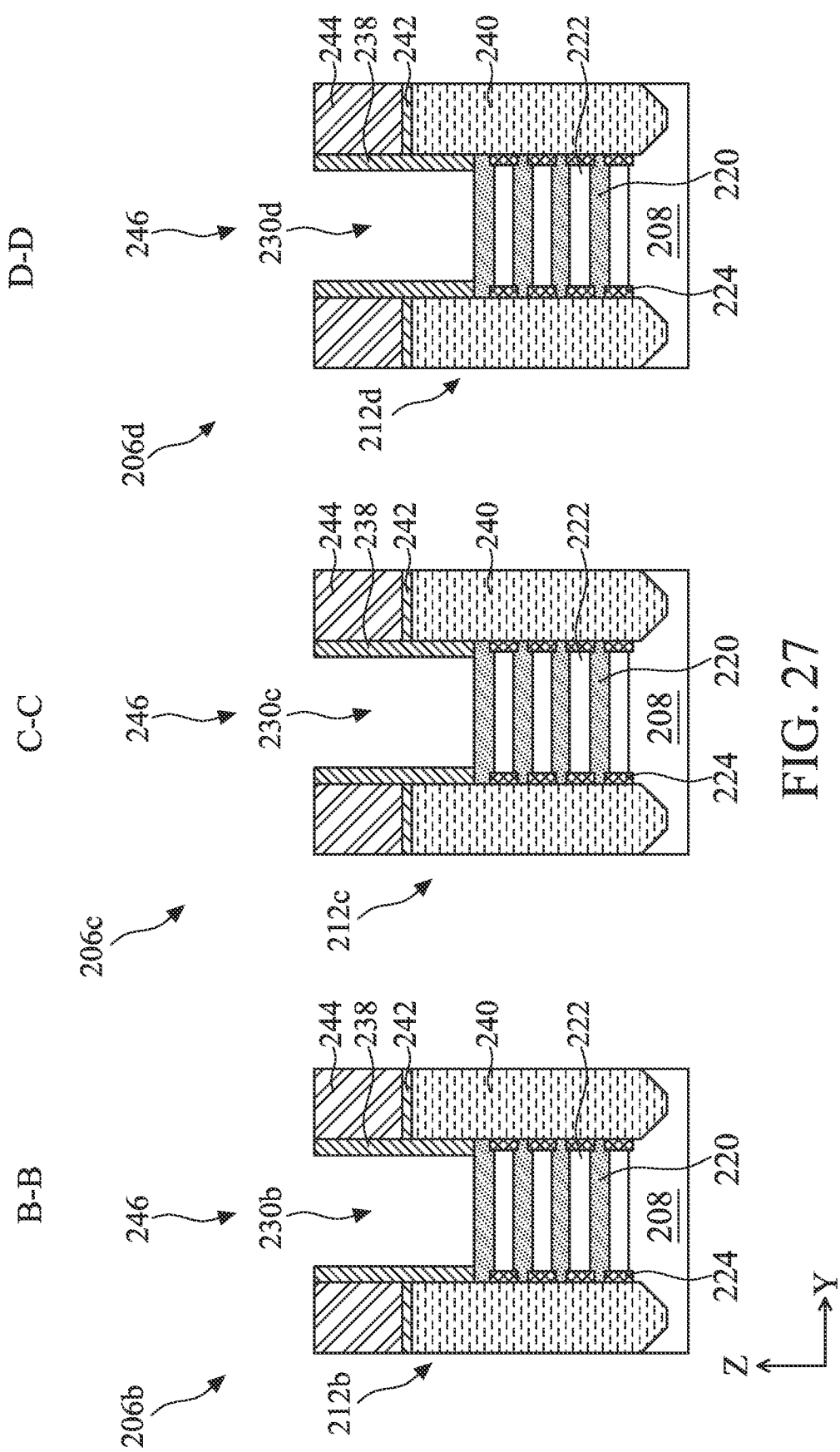

At operation 510, the method 500 (FIG. 1C) releases suspended nanostructures 220 in the exposed channel regions, as shown in FIG. 27. Because operation 510 is similar to operation 108 described above, detailed descriptions thereof are omitted for brevity.

Figure 28:
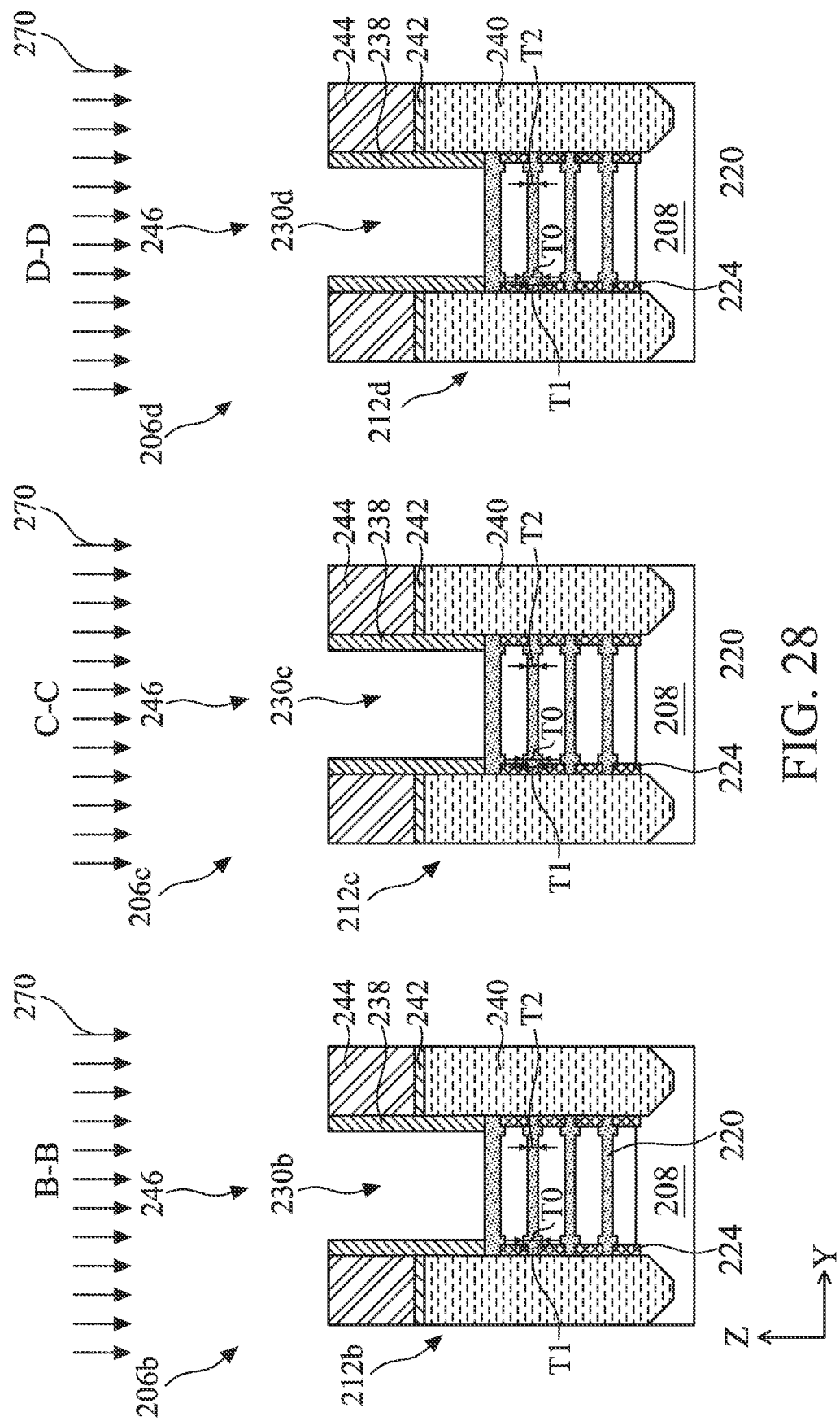

At operation 512, the method 500 (FIG. 1C) performs a trimming process 270 to reduce the thicknesses of the suspended nanostructures 220 in all three channel regions 230b-d (but not in the channel region 230a for n-type FETs), as shown in FIG. 28. After the trimming process 270, the suspended nanostructures 220 in the channel regions 212b-d have substantially the same dimensions (thickness and/or width). The trimming operation uses any suitable etching process such as dry etching, wet etching, and/or RIE. During the trimming process 270, the gate spacers 238 protect the suspended nanostructures 220 therebelow from being etched. The trimming process 270 selectively removes portions of the suspended nanostructures 220 that are vertically aligned with the gate trenches 246, while leaving the two end sections of the suspended nanostructure 220 substantially unetched. The trimmed thickness of the middle section of the suspended nanostructure 220 is denoted as T2. In the illustrated embodiment, a small portion of the suspended nanostructure 220 directly under the gate spacer 238 but not sandwiched by the inner spacers 224 may still remain the original thickness T0, which is larger than both the thickness T1 of the two end sections and the trimmed thickness T2 of the middle section, such as about 1 nm to about 3 nm larger. The trimmed thickness T2 may be smaller or larger than the thickness T1 of the two end sections, in various embodiments. In one embodiment, the trimmed thickness T2 substantially equals thickness T1. A reduced thickness of the suspended nanostructures may increase the threshold voltage of the field effect transistor, such that smaller thickness of the suspended nanostructures causes a greater increase in the threshold voltage. In some embodiments, an increase in a range from about 20 mv to about 100 mv can be achieved by trimming middle sections of the suspended nanostructures by about 1 nm to about 3 nm (T0-T2) proportionally.

Figure 29:
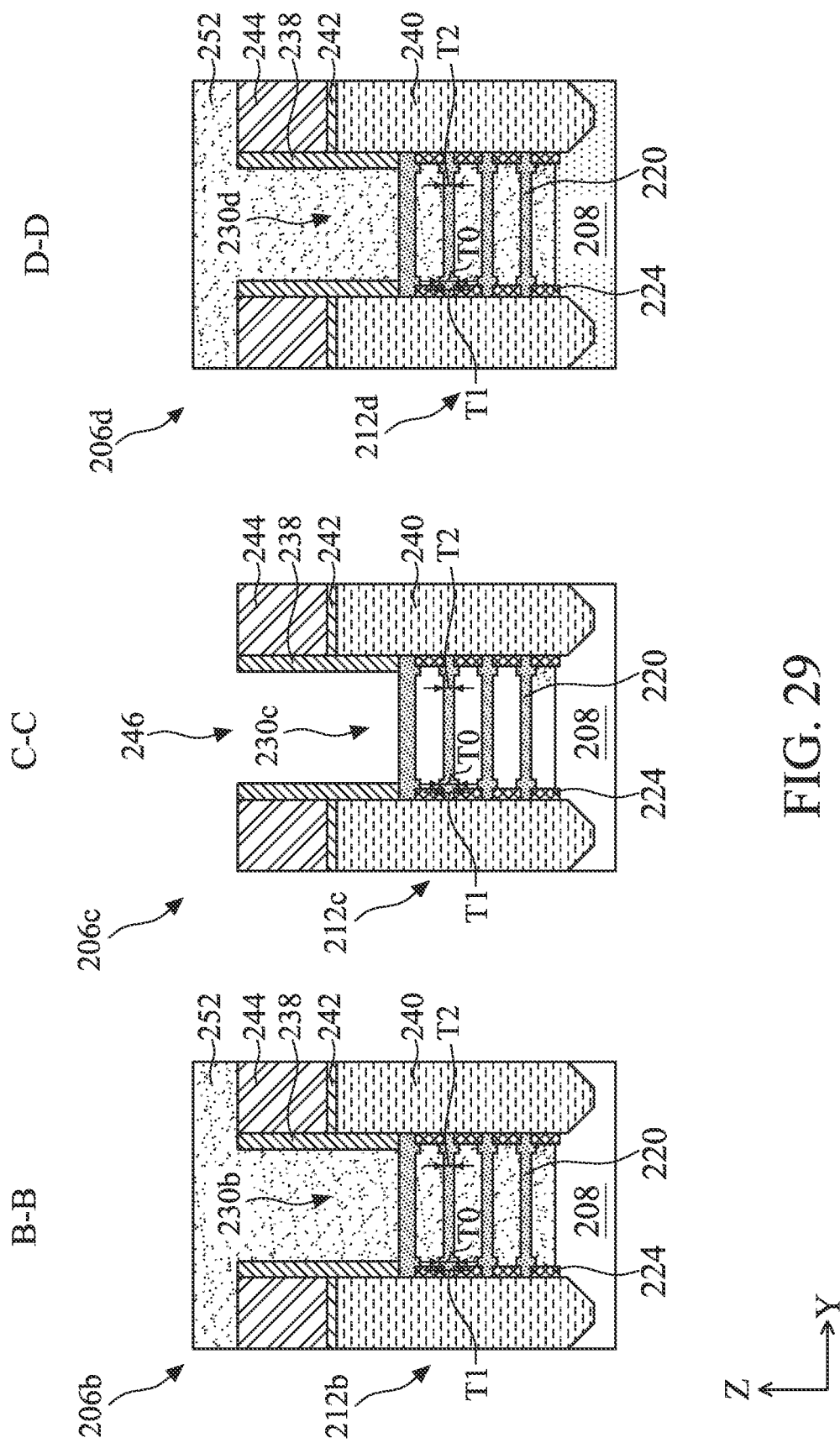

At operation 514, the method 500 (FIG. 1C) forms a patterned mask, such as a hard mask 252, on the top surface of the device 200, as shown in FIG. 29. The patterned mask covers the second and fourth device structures 206b and 206d and has an opening exposing the third device structure 206c. Because operation 514 is similar to operation 112 described above, detailed descriptions thereof are omitted for brevity.

Figure 30:
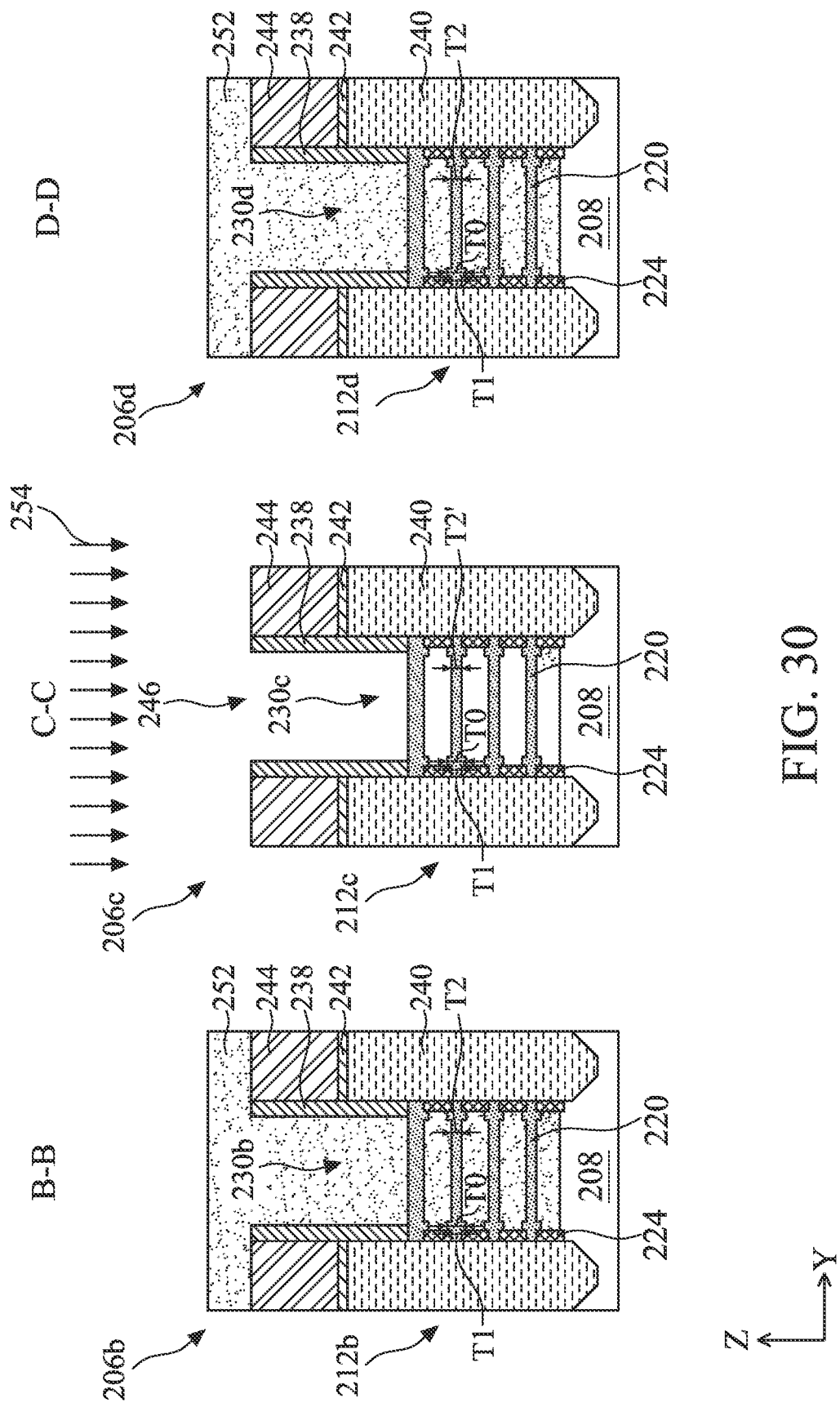

At operation 516, the method 500 (FIG. 1C) dopes a threshold modifying impurity into the channel region 230c to adjust threshold voltage of the third device structure 206c, such as shown in FIG. 30. The doping of the threshold modifying impurity (e.g., germanium implantation, low-temperature plasma doping, or germanium-containing epitaxial layer growing and anneal driving) is limited to the channel region 230c of the third device structure 206c. As a result, threshold voltage of the first p-type FET formed on the second device structure 206b in the SVt region and third p-type FET formed on the fourth device structure 206d in the HVt region are not further adjusted, while the second p-type FET formed on the third device structure 206c in the LVt region now has the lowest threshold voltage. Because operation 516 is similar to operation 114 described above, detailed descriptions thereof are omitted for brevity. As discussed above in association with operation 114, the middle sections of the suspended nanostructures receiving the threshold modifying impurity doping may grow in thickness. A thickness of the middle section of the suspended nanostructure in the channel region 230c (denoted as T2') may accordingly be larger than the thickness T2 in other channel regions 230b and 230d. The method 500 at operation 516 may also optionally perform a trimming operation to reduce the thickness T2' down to T2, such that suspended nanostructures 220 in all three regions substantially have the same dimensions.

Figure 31:
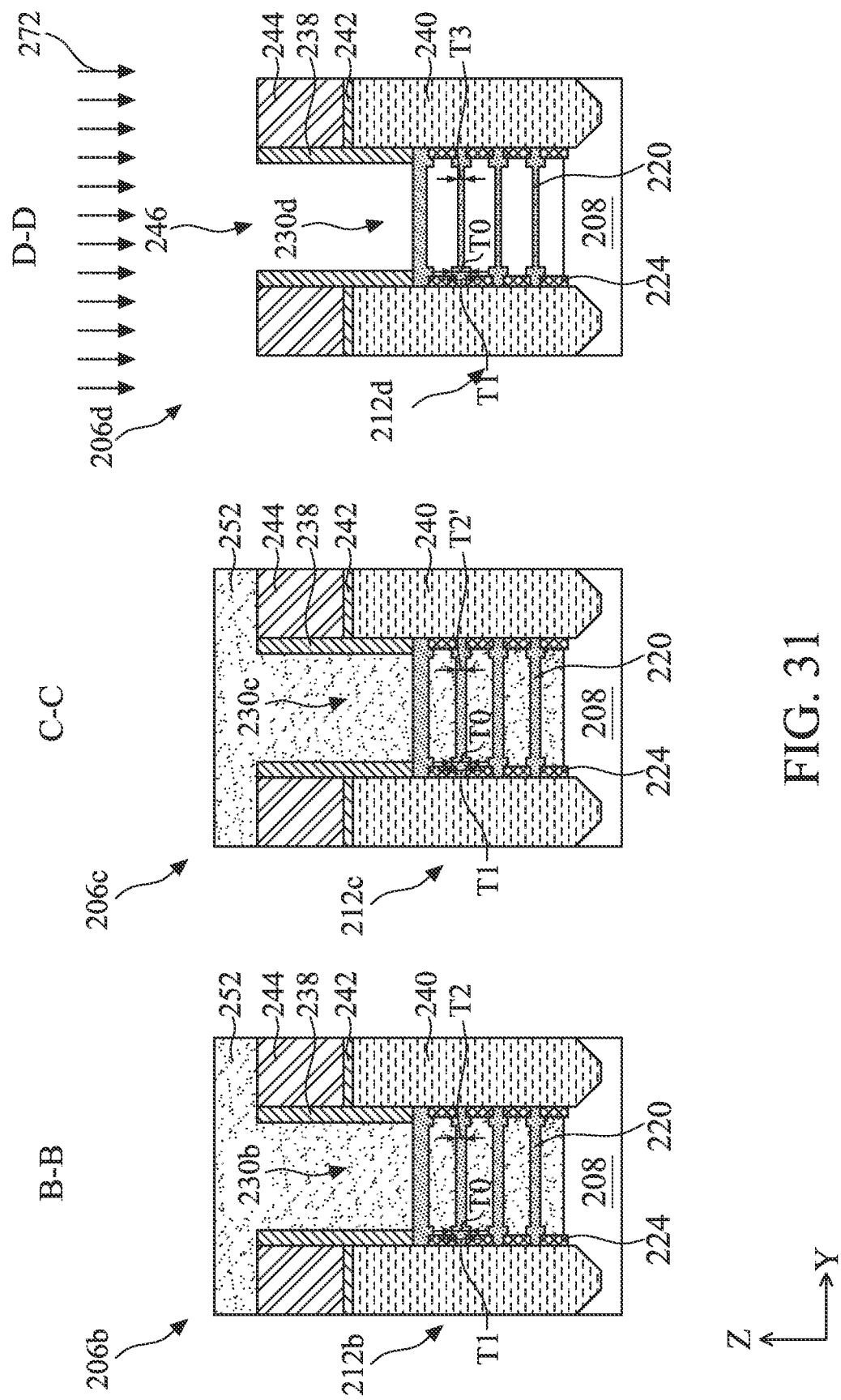

At operation 518, the method 500 (FIG. 1C) performs a second trimming process 272 to further reduce the thickness of the suspended nanostructures 220 in the channel region 230d in the HVt region, as shown in FIG. 31. The method 500 at operation 518 first forms a patterned mask to cover the second device structure 206b and the third device structure 206c with an opening to expose the fourth device structure 206d. The method 500 at operation 518 then performs a suitable etching process such as dry etching, wet etching, and/or RIE to remove extra portions from the middle sections of the suspended nanostructures 220 in the channel region 230d. Because operation 518 is similar to operation 316 described above, detailed descriptions thereof are omitted for brevity. As a result of the trimming process 272, the trimmed thickness of the middle section of the suspended nanostructure 220 is further reduced, denoted as T3. T3 is smaller than both T2 and T2'. Compared with the thickness T4 in the HVt transistor in FIG. 22 that receives three trimming processes in association with method 300 (FIG. 1B), the thickness T3 in the HVt transistor in FIG. 31 is a result of receiving two trimming processes, which is larger than T4 and has stronger mechanical strength for suspended nanostructures. Since a reduced thickness of the suspended nanostructures further increases the threshold voltage in the respective channel regions, the p-type transistor in the HVt region formed on the fourth device structure 230d thus has a threshold voltage larger than the p-type transistor formed on the second device structure 230b in the SVt region and p-type transistor formed on the third device structure 230c in the LVt region.

Figure 32:
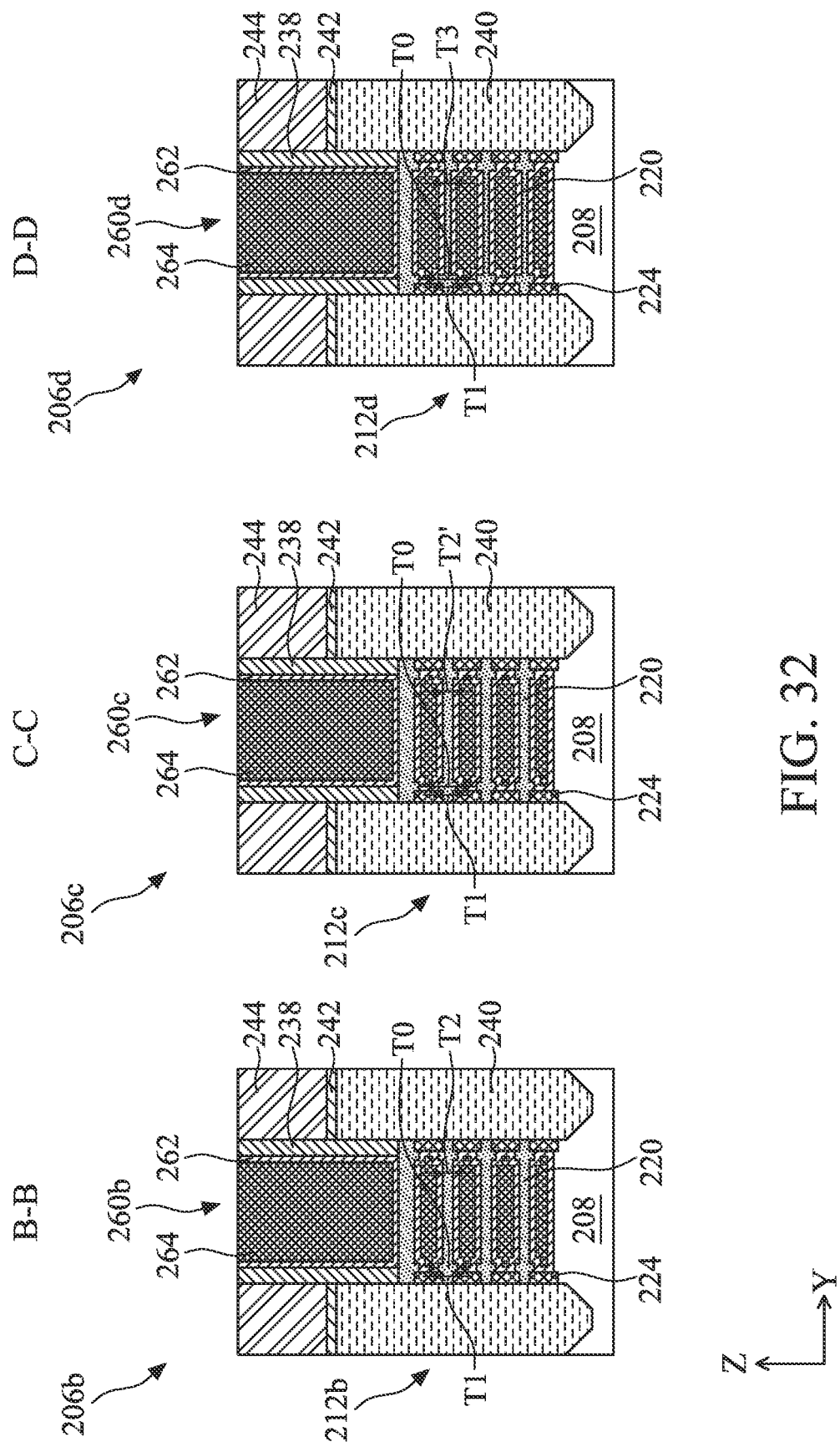

At operation 520, the method 500 (FIG. 1C) continues to form gate stacks over the respective channel regions, as shown in FIG. 32. Because operation 520 is similar to operation 116 described above, detailed descriptions thereof are omitted for brevity. Note that, due to the removal of extra portions of the suspended nanostructure 220 of the fourth device structure 206d, the gate metal layer 264 in the gate stack 260d has a larger volume than the gate metal layer 264 in the gate stack 260b and the gate metal layer 264 in the gate stack 260c. The channel layers of the third device structure 206c also further includes a threshold modifying impurity than the second and fourth device structures 206b and 206d. By doping threshold modifying impurity and trimming respective channel layers, threshold voltages can be fine-tuned without a need of complicated metal work function scheme in the gate stacks of the p-type FETS.

In either method 100, 300, or method 500, further processes may be performed to complete the fabrication of the device 200. For example, the method may continue to form contact openings, contact metal, as well as various contacts, vias, wires, and multilayer interconnect features (e.g., metal layers and interlayer dielectrics) over the GAA transistors, configured to connect the various features to form a functional circuit that may include one or more multi-gate devices.

Although not intended to be limiting, one or more embodiments of the present disclosure provide many benefits to a semiconductor device and a formation process thereof. According to some embodiments, threshold voltages of p-type GAA FETs are achieved with a simplified fabrication process. In some embodiments, various threshold voltages of p-type GAA FETs can be separately fin-tuned in different regions to form SVt, LVt, and/or HVt FETs based on device performance considerations. Further, embodiments of the present disclosure may be integrated into existing CMOS fabrication flow, providing for improved process window.

In one example aspect, the present disclosure provides a method of forming a semiconductor device. The method includes providing a substrate having a plurality of first semiconductor layers and a plurality of second semiconductor layers disposed over the substrate, wherein the first and second semiconductor layers have different material compositions and are alternatingly disposed with respect to each other in a vertical direction; patterning the first semiconductor layers and the second semiconductor layers to form a first fin and a second fin; removing the first semiconductor layers from the first and second fins such that a first portion of the patterned second semiconductor layers becomes first suspended nanostructures in the first fin and that a second portion of the patterned second semiconductor layers becomes second suspended nanostructures in the second fin; doping a threshold modifying impurity into the first suspended nanostructures in the first fin; forming a first gate stack over the first fin, wherein a portion of the first gate stack wraps around the first suspended nanostructures, thereby forming a first transistor with a first threshold voltage; and forming a second gate stack over the second fin, wherein a portion of the second gate stack wraps around the second suspended nanostructures, thereby forming a second transistor with a second threshold voltage that is larger than the first threshold voltage. In some embodiments, the threshold modifying impurity is Ge. In some embodiments, the doping of the threshold modifying impurity includes forming a plurality of third semiconductor layers on the first suspended nanostructures in the first fin; and performing an anneal process to drive the threshold modifying impurity contained in the third semiconductor layers into the first suspended nanostructures in the first fin. In some embodiments, the forming of the third semiconductor layers includes epitaxially growing each of the third semiconductor layers to surround a corresponding first suspended nanostructure in the first fin, and wherein the third semiconductor layers have different material compositions than the second semiconductor layers. In some embodiments, the third semiconductor layers include one of SiGe and GeSn. In some embodiments, the doping of the threshold modifying impurity includes applying a low-temperature plasma-enhanced doping process. In some embodiments, the method further includes doping the threshold modifying impurity into the second suspended nanostructures in the second fin, wherein the threshold modifying impurity has a higher concentration in the first suspended nanostructures in the first fin than in the second suspended nanostructures in the second fin. In some embodiments, the doping of the threshold modifying impurity into the first suspended nanostructures in the first fin includes a first doping of the threshold modifying impurity into both the first suspended nanostructures in the first fin and the second suspended nanostructures in the second fin simultaneously and a second doping of the threshold modifying impurity into the first suspended nanostructures in the first fin but not into the second suspended nanostructures in the second fin. In some embodiments, the method further includes prior to the doping of the threshold modifying impurity into the first suspended nanostructures, trimming the first and second suspended nanostructures to reduce thicknesses thereof. In some embodiments, the method further includes after the doping of the threshold modifying impurity into the first suspended nanostructures, trimming the second suspended nanostructures to further reduce the thickness thereof.

In another example aspect, the present disclosure provides a method. The method includes forming a plurality of first suspended layers in a first fin and a plurality of second suspended layers in a second fin, wherein the first and second suspended layers include a same first semiconductor material; performing a first etching process to remove portions of the first and second suspended layers simultaneously, thereby reducing thicknesses of the first and second suspended layers; performing a second etching process to remove extra portions of the second suspended layers without etching the first suspended layers, thereby further reducing the thickness of the second suspended layers; and forming first and second gate stacks engaging the first and second suspended layers, respectively. In some embodiments, the first gate stack and the first suspended layers are in a low threshold voltage (LVt) region and the second gate stack and the second suspended layers are in a standard threshold voltage (SVt) region. In some embodiments, the method further includes doping an impurity into the first suspended layers, wherein the second suspended layers are substantially devoid of the impurity. In some embodiments, the first gate stack and the first suspended layers are in a low threshold voltage (LVt) region and the second gate stack and the second suspended layers are in a high threshold voltage (HVt) region. In some embodiments, the doping of the impurity into the first suspended layers includes epitaxially growing a plurality of third layers on the first suspended layers, wherein the third layers include a second semiconductor material that differs from the first semiconductor material; and driving the impurity contained in the second semiconductor material to migrate from the third layers into the first suspended layers. In some embodiments, the method further includes forming a plurality of third suspended layers in a third fin, where the third suspended layers include the first semiconductor material; and performing a third etching process to remove portions of the third suspended layers without etching the first and second suspended layers, where the first and second etching processes also remove other portions of the third suspended layers, where after the performing of the third etching process, the first suspended layers are thicker than the second suspended layers and the second suspended layers are thicker than the third suspended layers.

In yet another example aspect, the present disclosure provides a semiconductor structure. The semiconductor structure includes a substrate; a first fin disposed on the substrate, the first fin including a plurality of first suspended nanostructures vertically stacked over one another; a first gate stack engaging the first suspended nanostructures; a second fin disposed on the substrate, the second fin including a plurality of second suspended nanostructures vertically stacked over one another; and a second gate stack engaging the second suspended nanostructures, where a concentration of germanium in middle sections of the first suspended nanostructures is higher than a concentration of germanium in middle sections of the second suspended nanostructures. In some embodiments, the concentration of germanium in the middle sections of the first suspended nanostructures is higher than a concentration of germanium in two end sections of the first suspended nanostructures. In some embodiments, a thickness of the middle sections of the first suspended nanostructures is larger than a thickness of the middle sections of the second suspended nanostructures. In some embodiments, the thickness of the center sections of the second suspended nanostructures is smaller than a thickness of two end sections of the second suspended nanostructures.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
 a substrate;
 a first transistor comprising:
  a plurality of first suspended nanostructures vertically stacked over one another and disposed on the substrate;
  a first gate stack having a first gate dielectric layer and a first gate metal layer, the first gate dielectric layer and the first gate metal layer each fully wrapping around at least one of the first suspended nanostructures; and
  a first gate spacer disposed on sidewalls of the first gate stack; and
 a second transistor comprising:
  a plurality of second suspended nanostructures vertically stacked over one another and disposed on the substrate;
  a second gate stack having a second gate dielectric layer and a second gate metal layer, the second gate dielectric layer and the second gate metal layer each fully wrapping around at least one of the second suspended nanostructures; and
  a second gate spacer disposed on sidewalls of the second gate stack,
 wherein a middle portion of the first suspended nanostructures has a first thickness measured in a direction perpendicular to a top surface of the substrate, a middle portion of the second suspended nanostructures has a second thickness measured in the direction, and the second thickness is smaller than the first thickness, wherein a topmost one of the first suspended nanostructures is above a bottommost one of the second suspended nanostructures, and a topmost one of the second suspended nanostructures is above a bottommost one of the first suspended nanostructures, wherein the first transistor and the second transistor are of a same conductivity type.

2. The semiconductor device of claim 1, wherein the first gate stack and the first suspended nanostructures are portions of a first transistor with a first threshold voltage, the second gate stack and the second suspended nanostructures are portions of a second transistor with a second threshold voltage, and the second threshold voltage is larger than the first threshold voltage.

3. The semiconductor device of claim 1, wherein the first gate stack and the first suspended nanostructures are in a low threshold voltage (LVt) region and the second gate stack and the second suspended nanostructures are in a standard threshold voltage (SVt) region.

4. The semiconductor device of claim 1, wherein the second thickness is about 1 nm to about 3 nm smaller than the first thickness.

5. The semiconductor device of claim 1, wherein the middle portion of the second suspended nanostructures is thinner than a side portion of the second suspended nanostructures that is directly under the second gate spacer.

6. The semiconductor device of claim 5, wherein the middle portion of the first suspended nanostructures is thinner than a side portion of the first suspended nanostructures that is directly under the first gate spacer.

7. The semiconductor device of claim 5, wherein the middle portion of the first suspended nanostructures has a substantially same thickness as a side portion of the first suspended nanostructures that is directly under the first gate spacer, and wherein the first suspended nanostructures are disposed in an n-type region of the semiconductor device.

8. The semiconductor device of claim 1, wherein the first suspended nanostructures include a threshold modifying impurity, and wherein the second suspended nanostructures are substantially free of the threshold modifying impurity.

9. The semiconductor device of claim 1, further comprising:
a plurality of third suspended nanostructures vertically stacked over one another and disposed on the substrate;
a third gate stack engaging the third suspended nanostructures; and
a third gate spacer disposed on sidewalls of the third gate stack,
wherein a middle portion of the third suspended nanostructures has a third thickness measured in the direction, and wherein the third thickness is smaller than the second thickness.

10. A semiconductor device, comprising:
a substrate;
a plurality of first suspended nanostructures vertically stacked over one another and disposed in an n-type region of the semiconductor device;
a first gate stack wrapping around each of the first suspended nanostructures;
a plurality of second suspended nanostructures vertically stacked over one another and disposed in a p-type region of the semiconductor device; and
a second gate stack wrapping around each of the second suspended nanostructures, wherein the second suspended nanostructures include a threshold modifying impurity, and the first suspended nanostructures are free of the threshold modifying impurity, and wherein a concentration of the threshold modifying impurity in a middle section of the second suspended nanostructures is higher than a concentration of the threshold modifying impurity in two end sections of the second suspended nanostructures.

11. The semiconductor device of claim 10, wherein a thickness of the middle section of the second suspended nanostructures is larger than a thickness of a middle section of the first suspended nanostructures.

12. The semiconductor device of claim 10, wherein a thickness of the middle section of the second suspended nanostructures is smaller than a thickness of a middle section of the first suspended nanostructures.

13. The semiconductor device of claim 10, wherein the threshold modifying impurity is germanium.

14. The semiconductor device of claim 10, wherein a thickness of the middle section of the second suspended nanostructures is larger than a thickness of the two end sections of the second suspended nanostructures.

15. A method of forming a semiconductor device, comprising:
providing a structure having a substrate, a plurality of first nanostructures stacked in a vertical direction and suspended above a first region of the substrate, and a plurality of second nanostructures stacked in the vertical direction and suspended above a second region of the substrate;
doping a threshold modifying impurity into the first nanostructures;
forming a first gate stack wrapping around the first nanostructures, thereby forming a first transistor with a first threshold voltage; and
forming a second gate stack wrapping around the second nanostructures, thereby forming a second transistor with a second threshold voltage that is different from the first threshold voltage.

16. The method of claim 15, wherein the first and second regions are both p-type regions.

17. The method of claim 15, further comprising:
after the doping of the threshold modifying impurity, trimming the first nanostructures to reduce a thickness of the first nanostructures.

18. The method of claim 15, wherein after the forming of the first and second gate stacks, the second nanostructures are substantially free of the threshold modifying impurity.

19. The method of claim 15, wherein the doping of the threshold modifying impurity includes a first impurity doping process and a second impurity doping process after the first impurity doping process, wherein the first nanostructures receive the threshold modifying impurity in both the first and second impurity doping processes, and wherein the second nanostructures receive the threshold modifying impurity from the first impurity doping process but not from the second impurity doping process.

20. The method of claim 15, wherein a concentration of the threshold modifying impurity in the first nanostructures are higher than that in the second nanostructures, and the second threshold voltage is larger than the first threshold voltage.

* * * * *